(12) United States Patent
Kato et al.

(10) Patent No.: US 10,389,930 B2
(45) Date of Patent: Aug. 20, 2019

(54) IMAGE PICKUP DEVICE AND IMAGE PICKUP SYSTEM

(71) Applicant: CANON KABUSHIKI KAISHA, Tokyo (JP)

(72) Inventors: Taro Kato, Kawasaki (JP); Jun Iba, Yokohama (JP); Kazunari Kawabata, Kawasaki (JP); Takeshi Kojima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/725,584

(22) Filed: May 29, 2015

(65) Prior Publication Data

US 2015/0350529 A1 Dec. 3, 2015

(30) Foreign Application Priority Data

Jun. 2, 2014 (JP) .................................. 2014-114432

(51) Int. Cl.
*H04N 5/232* (2006.01)
*H01L 27/146* (2006.01)
*H04N 5/369* (2011.01)
*H04N 5/3745* (2011.01)

(52) U.S. Cl.
CPC ..... *H04N 5/23212* (2013.01); *H01L 27/1464* (2013.01); *H01L 27/14623* (2013.01); *H01L 27/14627* (2013.01); *H04N 5/3696* (2013.01); *H04N 5/37457* (2013.01)

(58) Field of Classification Search
CPC ............ H04N 5/23212; H04N 5/3696; H04N 5/37457; H01L 27/1464; H01L 27/14623; H01L 27/14627
See application file for complete search history.

(56) References Cited

U.S. PATENT DOCUMENTS

| 2004/0165097 A1 | 8/2004 | Drowley et al. |
| 2006/0023314 A1 | 2/2006 | Boettiger et al. |
| 2006/0027825 A1* | 2/2006 | Kuriyama ......... H01L 27/14627 257/98 |

(Continued)

FOREIGN PATENT DOCUMENTS

| CN | 102822716 A | 12/2012 |
| CN | 103208499 A | 7/2013 |

(Continued)

*Primary Examiner* — Mekonnen D Dagnew
(74) *Attorney, Agent, or Firm* — Canon U.S.A., Inc., IP Division

(57) ABSTRACT

An image pickup device includes a pixel region having a plurality of pixels that are two-dimensionally arranged, the plurality of pixels including a plurality of image pickup pixels and a plurality of focus detection pixels capable of phase difference detection; a plurality of microlenses arranged to correspond to respective photoelectric conversion units of respective image pickup pixels; and a plurality of microlenses arranged to correspond to respective photoelectric conversion units of the respective focus detection pixels. When at least one of the plurality of microlenses is orthogonally projected onto the corresponding photoelectric conversion unit, a vertex position of the at least one microlens is off a center position of the at least one microlens.

22 Claims, 26 Drawing Sheets

(56) References Cited

U.S. PATENT DOCUMENTS

| | | | |
|---|---|---|---|
| 2007/0222885 A1* | 9/2007 | Katsuno | H04N 5/335 348/340 |
| 2008/0011936 A1 | 1/2008 | Kuo et al. | |
| 2008/0135896 A1 | 6/2008 | Fan et al. | |
| 2009/0174945 A1 | 7/2009 | Lin et al. | |
| 2009/0278966 A1 | 11/2009 | Kusaka | |
| 2009/0295964 A1 | 12/2009 | Utagawa et al. | |
| 2011/0080509 A1 | 4/2011 | Katsuno et al. | |
| 2012/0043634 A1 | 2/2012 | Kurihara | |
| 2012/0200751 A1* | 8/2012 | Kato | H01L 27/14627 348/294 |
| 2012/0300104 A1 | 11/2012 | Onuki et al. | |
| 2013/0021499 A1 | 1/2013 | Ui et al. | |
| 2013/0076970 A1 | 3/2013 | Kishi | |
| 2014/0146208 A1* | 5/2014 | Nakajima | H04N 5/3696 348/294 |

FOREIGN PATENT DOCUMENTS

| | | |
|---|---|---|
| EP | 2007-035837 A | 2/2007 |
| EP | 2362257 A1 | 8/2011 |
| EP | 2723062 A1 | 4/2014 |
| JP | H04-034977 A | 2/1992 |
| JP | 2007-035837 A | 2/2007 |
| JP | 2007-335723 A | 12/2007 |
| JP | 2009-086144 A | 4/2009 |
| JP | 2009-109965 A | 5/2009 |
| JP | 2009-290157 A | 12/2009 |
| JP | 2009-302483 A | 12/2009 |
| JP | 2010-140013 A | 6/2010 |
| JP | 2012-204449 A | 10/2012 |
| JP | 2014-072541 A | 4/2014 |
| JP | 2014-089432 A | 5/2014 |
| WO | 2005/008781 A1 | 1/2005 |
| WO | 2011/061998 A1 | 5/2011 |
| WO | 2011/126103 A1 | 10/2011 |
| WO | 2013/128925 A1 | 9/2013 |

* cited by examiner

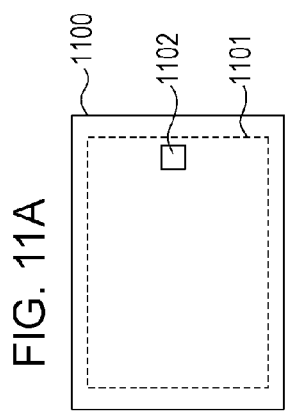
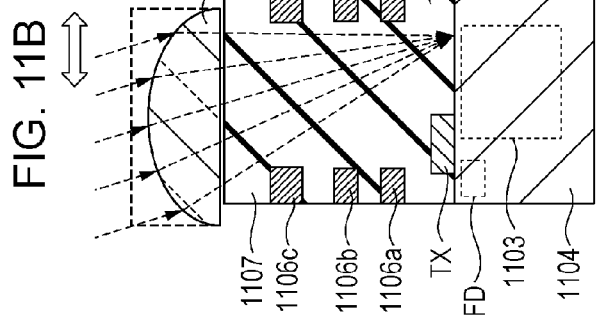
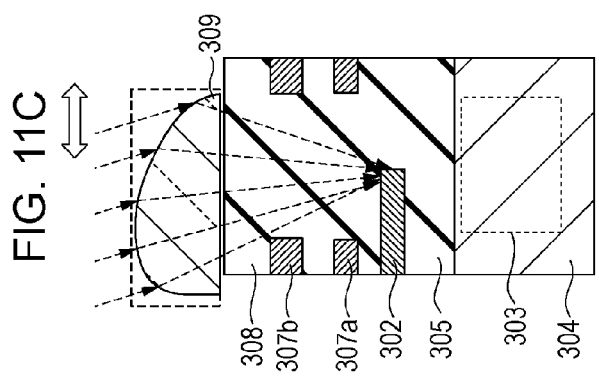
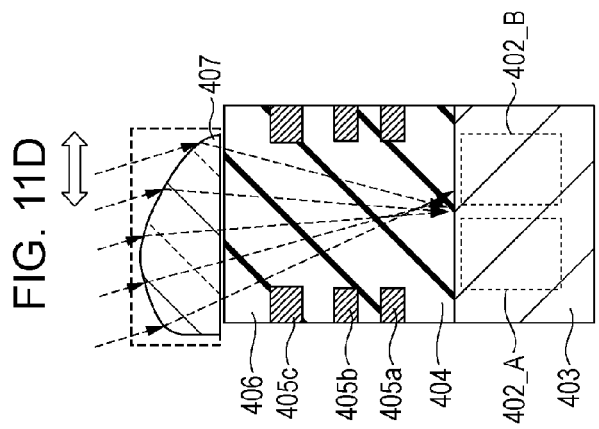

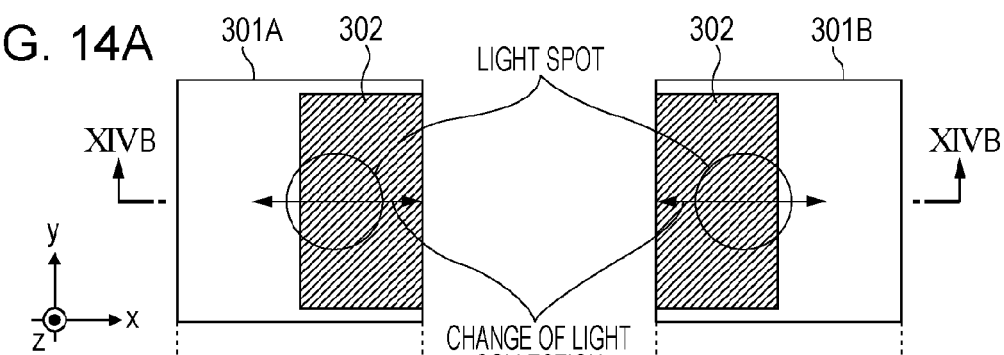
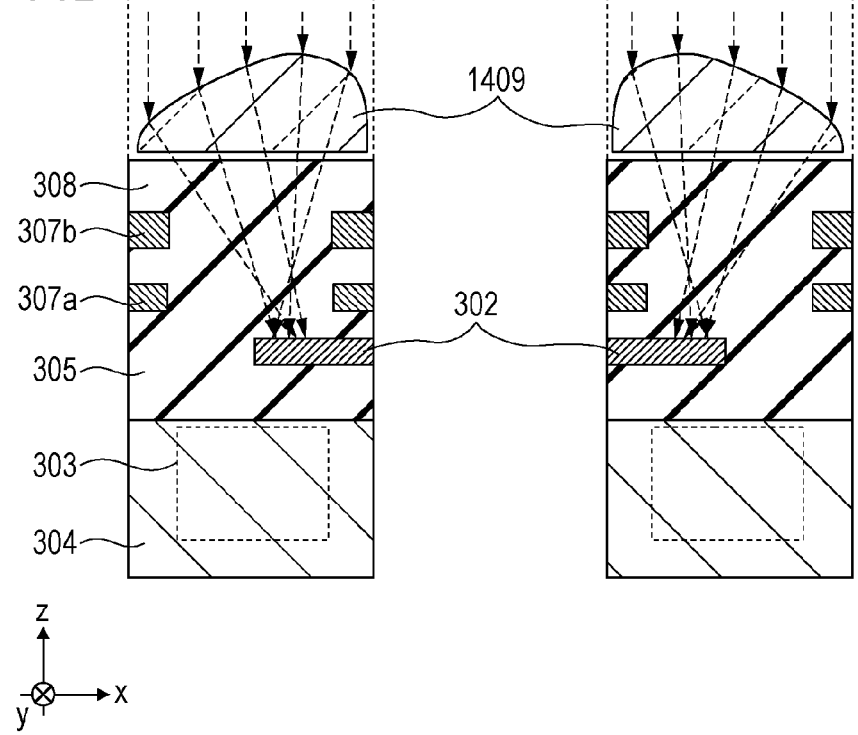

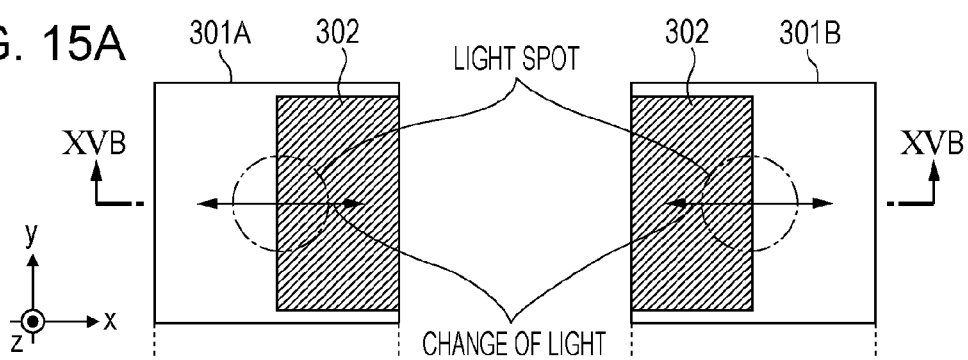
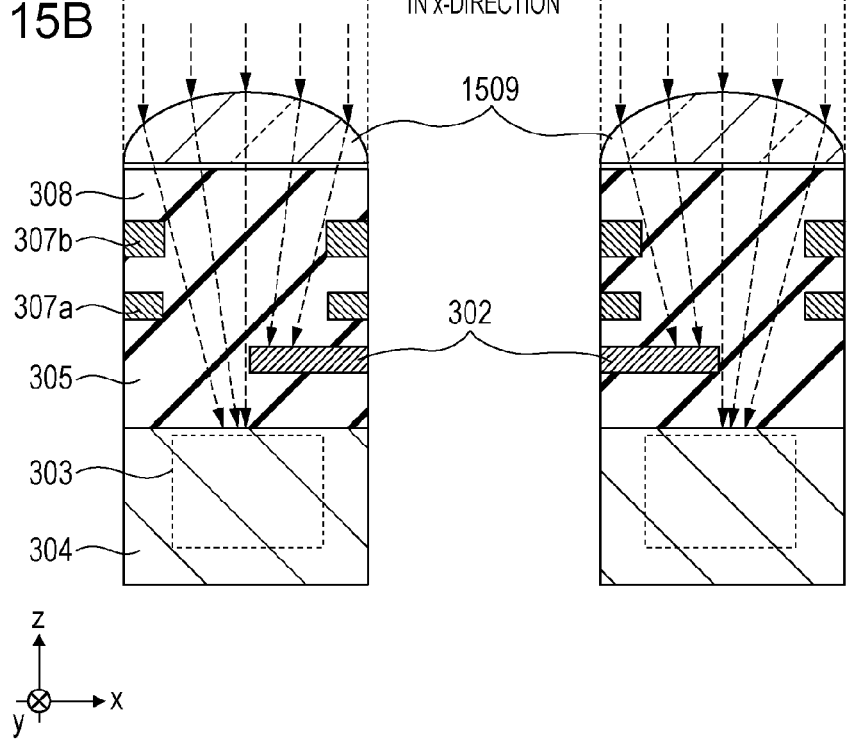

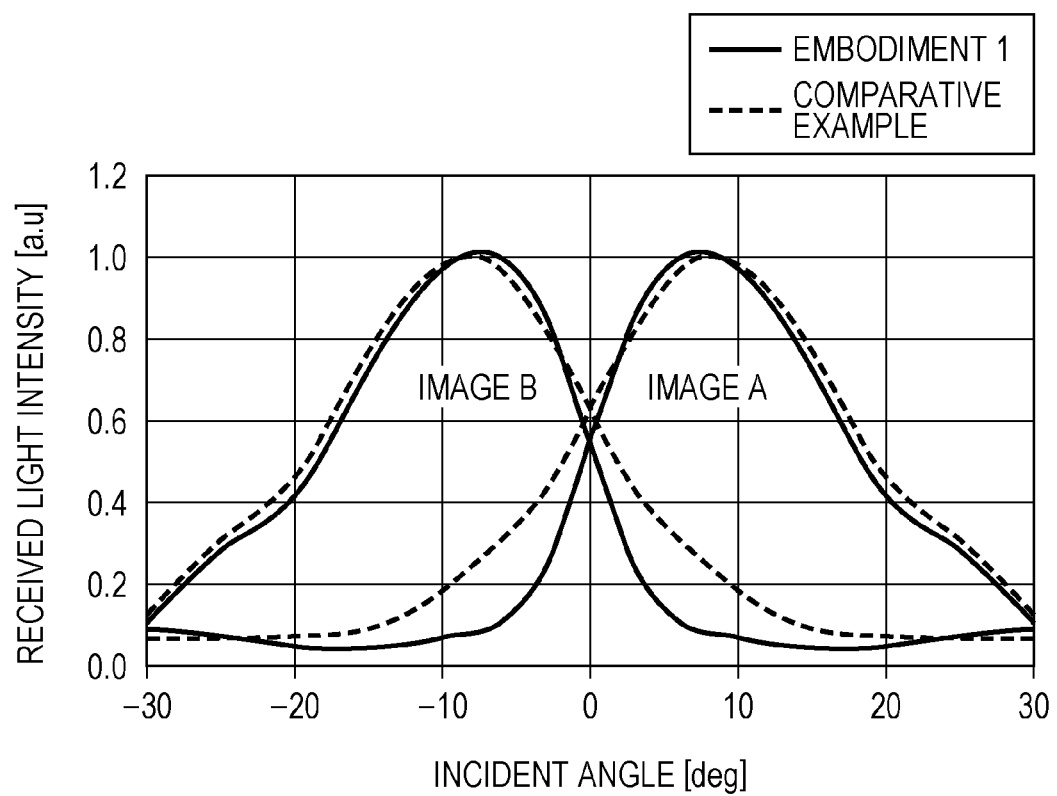

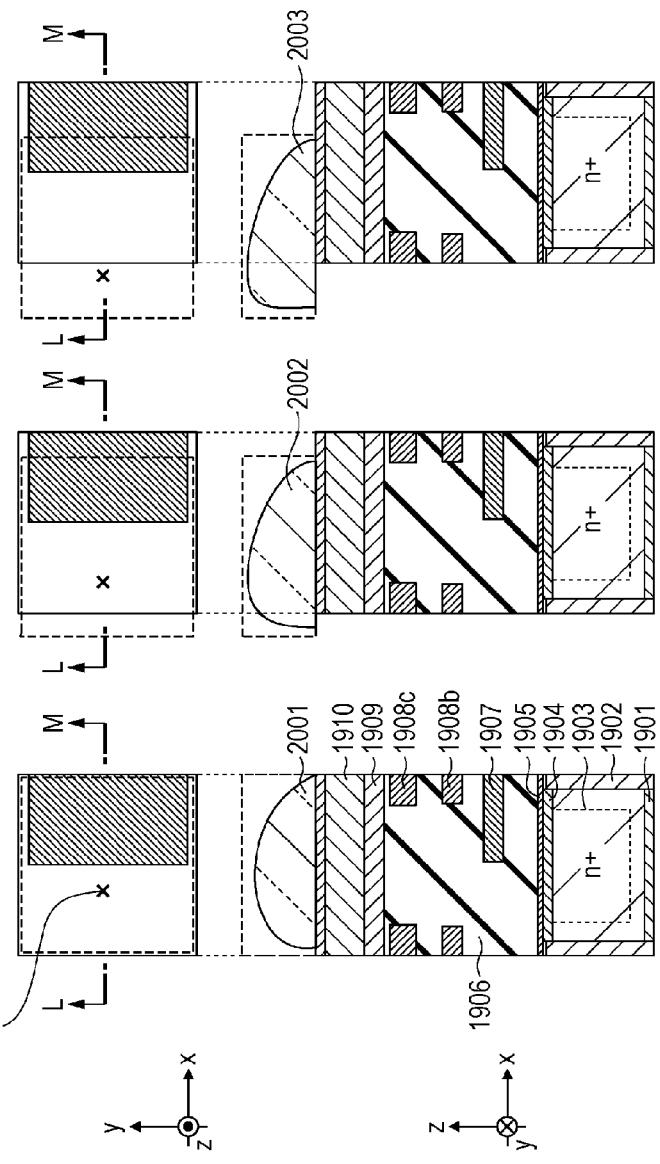

FIG. 21A
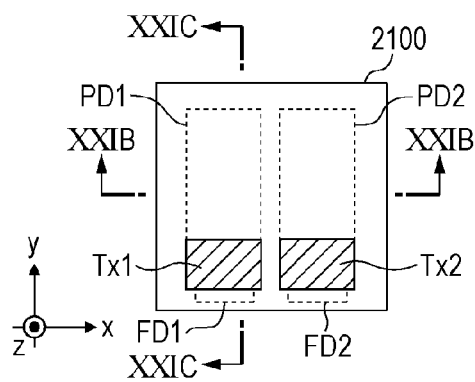
FIG. 21B
FIG. 21C
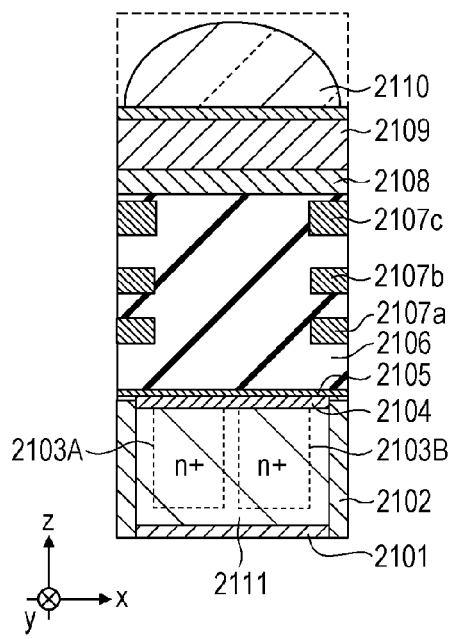
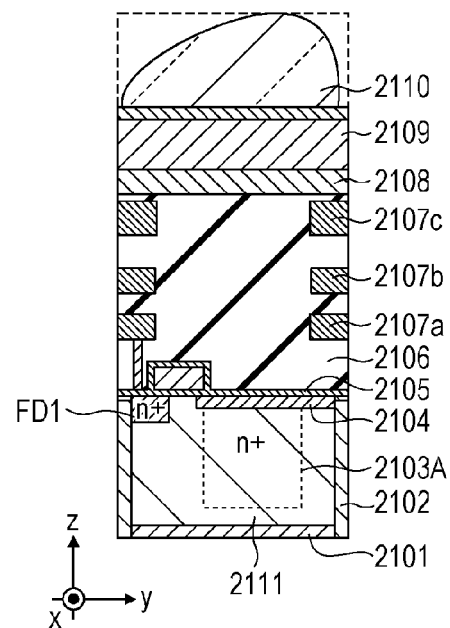

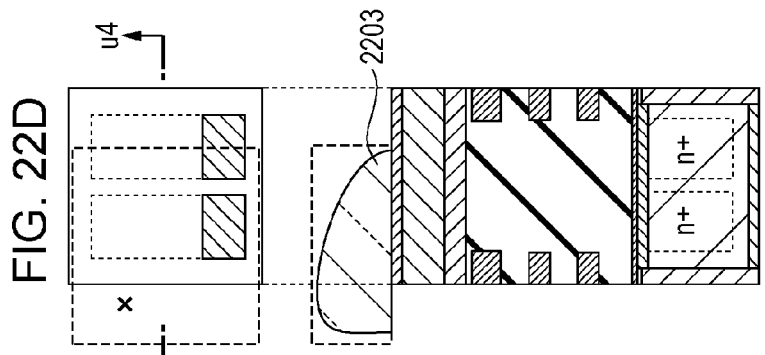
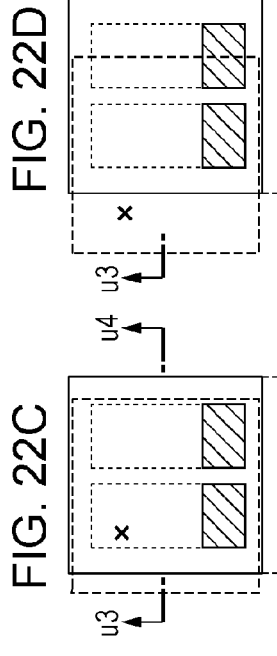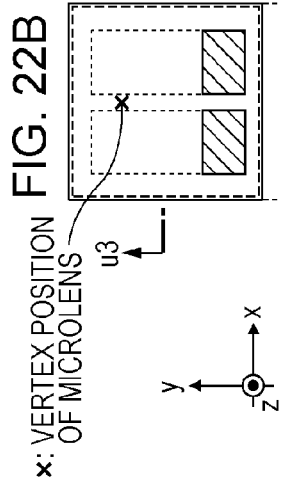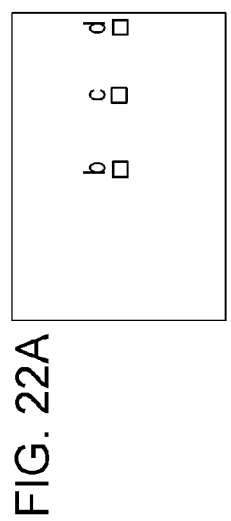

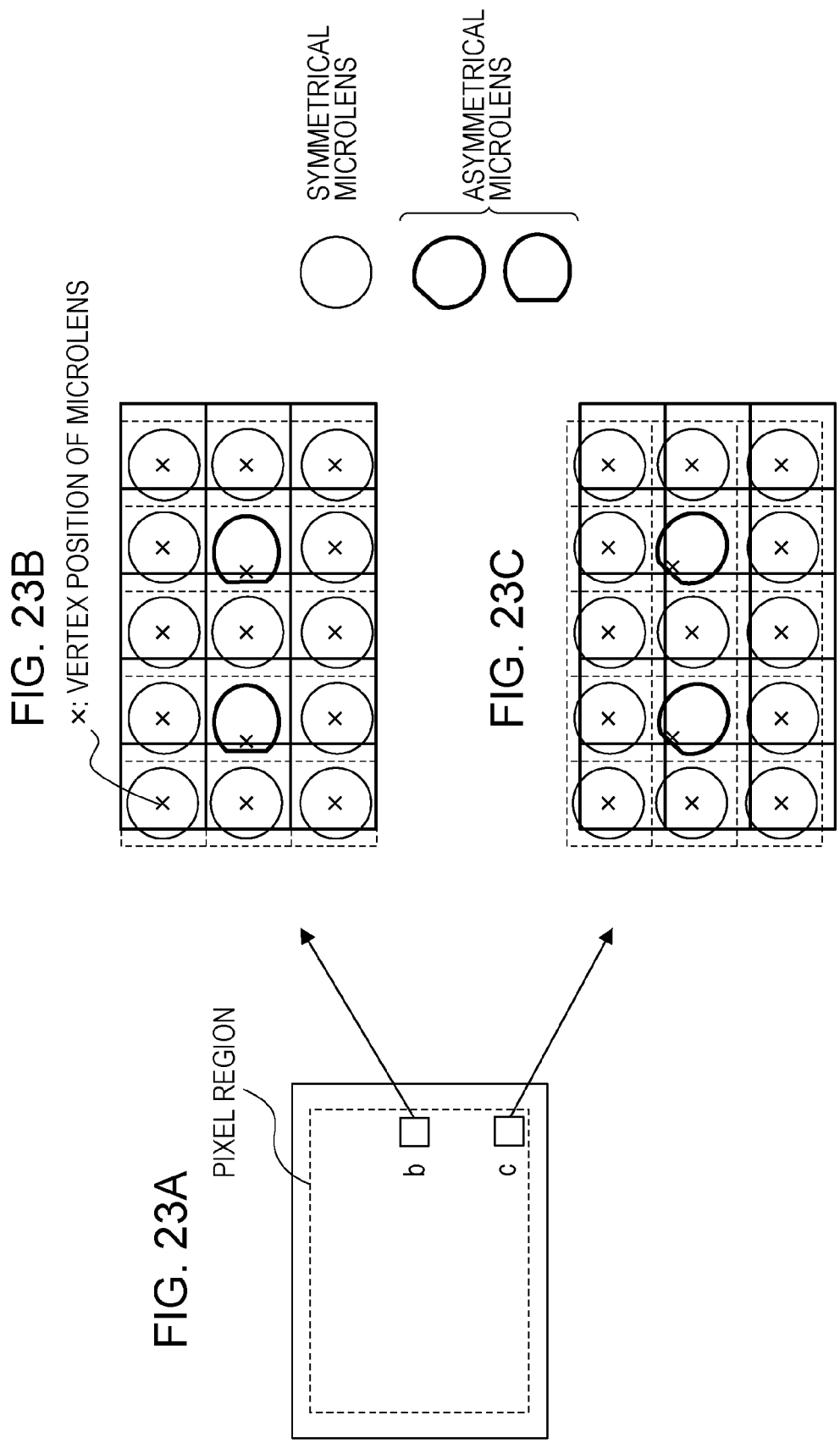

IMAGE PICKUP DEVICE AND IMAGE PICKUP SYSTEM

BACKGROUND OF THE INVENTION

Field of the Invention

The present invention relates to an image pickup device including an asymmetrical microlens, and to an image pickup system.

Description of the Related Art

Japanese Patent Laid-Open Nos. 2009-109965 and 2009-290157 each describe an image pickup device in which image pickup pixels, and focus detection pixels capable of phase difference detection, are provided in an imaging plane. Japanese Patent Laid-Open No. 2009-109965 discloses a structure in which the focal point of a microlens for a focus detection pixel is closer to the microlens than the focal point of a microlens for an image pickup pixel. Japanese Patent Laid-Open No. 2009-290157 discloses a structure in which the position of a microlens for a focus detection pixel and the position of a microlens for an image pickup pixel are varied in accordance with an image height.

Japanese Patent Laid-Open No. 2009-086144 discloses a structure in which pixels forming a set of pixels are provided with respective microlenses of different shapes. Then, focus detection is performed by comparing the outputs from these pixels.

Japanese Patent Laid-Open Nos. 2009-109965 and 2009-290157 each state that focus detection accuracy can be improved in the image pickup device which includes focus detection pixels and image pickup pixels provided in the imaging plane. However, no sufficient studies have been done to improve both focus detection accuracy based on phase difference detection and image pickup performance. The term "image pickup performance" refers to, for example, sensitivity to oblique incident light, or capability to reduce mixing of colors derived from adjacent pixel signals of different colors. Japanese Patent Laid-Open No. 2009-086144 states that it is possible to eliminate the need of an optical path splitting unit. However, again, no sufficient studies have been done to improve both focus detection accuracy and image pickup performance.

SUMMARY OF THE INVENTION

In view of the problems described above, the present invention provides an image pickup device that has pixels capable of phase difference detection in an imaging plane, and can improve both focus detection accuracy and image pickup performance.

An image pickup device according to an aspect of the present invention includes a pixel region having a plurality of pixels that are two-dimensionally arranged, the plurality of pixels including a plurality of image pickup pixels and a plurality of focus detection pixels, the focus detection pixels each being configured to output a signal for focus detection based on phase difference detection; a plurality of microlenses arranged to correspond to respective photoelectric conversion units of the respective image pickup pixels; and a plurality of microlenses arranged to correspond to respective photoelectric conversion units of the respective focus detection pixels. At least one of the plurality of microlenses is an asymmetrical microlens whose vertex position is off a center position thereof in plan view.

Further features of the present invention will become apparent from the following description of embodiments with reference to the attached drawings. Each of the embodiments of the present invention described below can be implemented solely or as a combination of a plurality of the embodiments or features thereof where necessary or where the combination of elements or features from individual embodiments in a single embodiment is beneficial.

BRIEF DESCRIPTION OF THE DRAWINGS

FIG. 11A is a top view of an image pickup device including an asymmetrical microlens according to the embodiment of the present invention, and FIGS. 11B to 11D illustrate cross-sectional structures of a target pixel in FIG. 11A.

FIGS. 14A and 14B illustrate other pixels in the image pickup device of embodiment 1.

FIGS. 15A and 15B are a top view and a cross-sectional view, respectively, of pixels in an image pickup device of a comparative example.

FIG. 16 shows optical characteristics of embodiment 1 and the comparative example.

FIG. 20A is a top view of the image pickup device of embodiment 3, and FIGS. 20B to 20D each provide a top view and a cross-sectional view of a pixel in FIG. 20A.

FIG. 21A is a top view of a pixel in an image pickup device of embodiment 4, and FIGS. 21B and 21C are cross-sectional views of FIG. 21A.

FIG. 22A is a top view of the image pickup device of embodiment 4, and FIGS. 22B to 22D each provide a top view and a cross-sectional view of a pixel in FIG. 22A.

FIG. 23A is a top view of a pixel region in an image pickup device of embodiment 5, and FIGS. 23B and 23C are each a top view of pixels in FIG. 23A.

DESCRIPTION OF THE EMBODIMENTS

An image pickup system and an image pickup device according to an embodiment of the present invention will be described with reference to FIGS. 1 and 2.

Figure 1:
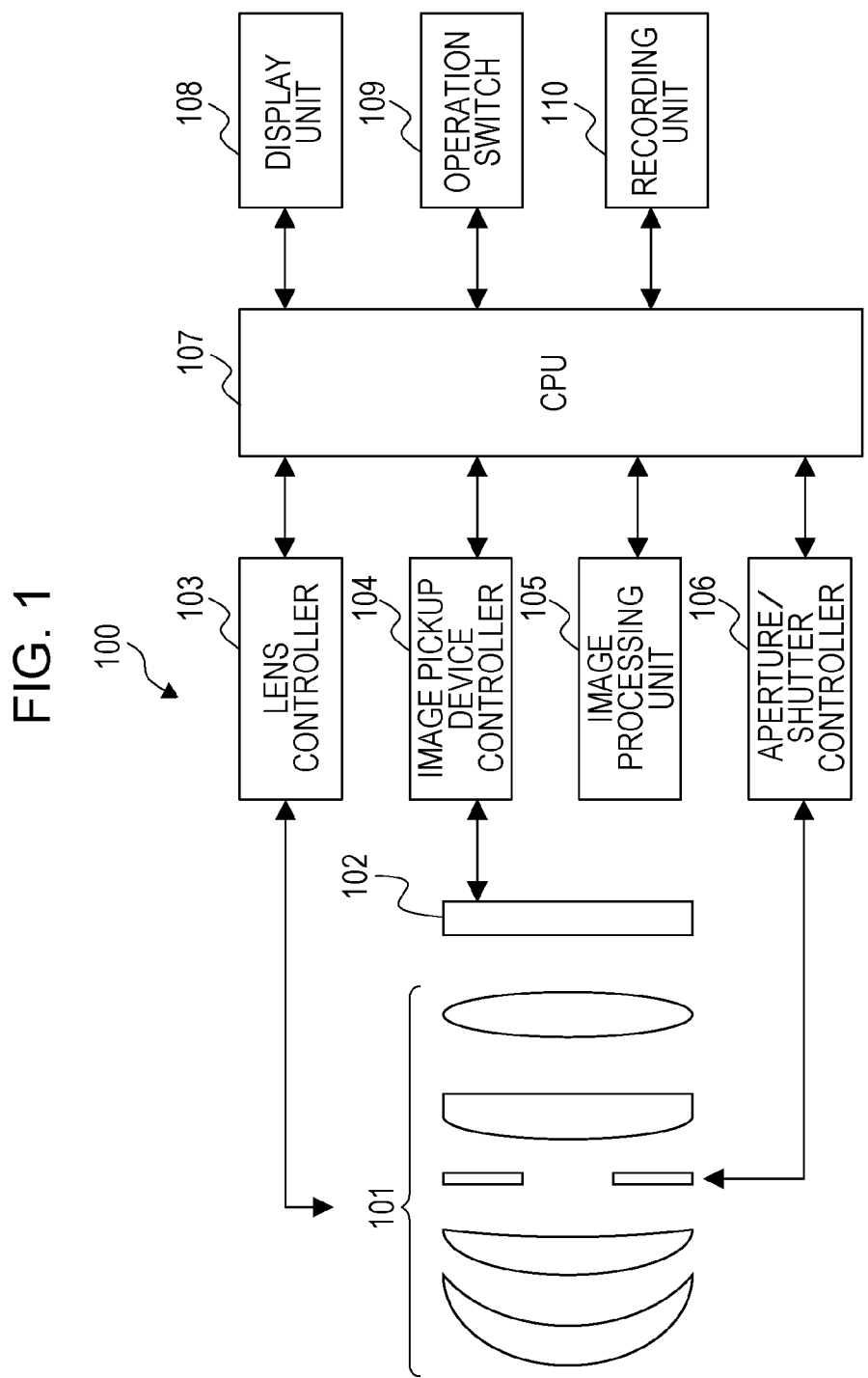
FIG. 1 is a general block diagram of an image pickup system applicable to the present invention.

FIG. 1 is a block diagram of an image pickup system. An image pickup system 100 includes an image pickup lens 101, an image pickup device 102, a lens controller 103, an image pickup device controller 104, an image processing unit 105, an aperture/shutter controller 106, a central processing unit (CPU) 107, a display unit 108, an operation switch 109, and a recording unit 110.

The image pickup device 102 of the present embodiment is capable of focus detection based on a phase difference in an imaging plane. The focus detecting operation will now be described.

Light from a subject passes through the image pickup lens 101 and is collected onto the image pickup device 102. The image pickup device 102 converts the light incident through the image pickup lens 101 into an electric signal, performs predetermined processing on the electric signal, and outputs the resulting signal to the CPU 107.

The operation of the image pickup device 102 is controlled in accordance with a control signal from the image pickup device controller 104. The image pickup device controller 104 receives a phase difference detection signal and the like from the image pickup device 102, and transmits an image signal and a signal indicating an in-focus state to the CPU 107. Additionally, the image pickup device controller 104 transmits a control signal for switching the drive mode of the image pickup device 102 to the image pickup device 102. Upon receipt of the signals from the image pickup device controller 104, the CPU 107 transmits the signal indicating the in-focus state to the lens controller 103. In response to the signal from the CPU 107, the lens controller 103 drives the image pickup lens 101. This operation makes it possible to adjust the in-focus state of the image pickup device 102.

The CPU 107 transmits an image signal output from the image pickup device 102 to the image processing unit 105. The image signal processed by the image processing unit 105 is displayed by the display unit 108 and recorded in the recording unit 110. The operation switch 109 is provided for the user to change the image pickup operation of the image pickup system 100 depending on the subject or the like. The aperture/shutter controller 106 receives a signal from the CPU 107, and controls the opening and closing state of the aperture and/or mechanical shutter such that the amount of exposure is appropriate for the brightness of the subject.

The image pickup device 102 will now be described with reference to FIG. 2.

A plurality of pixels are two-dimensionally arranged in a pixel region 201. A plurality of pixels arranged in a line in an up-down direction in the drawing form a pixel column, and a plurality of pixels arranged in a direction orthogonal to the pixel column form a pixel row. In response to control pulses from a vertical scanning circuit 202, signals of respective pixel rows are output substantially simultaneously to a plurality of corresponding signal output lines. After being output to the signal output lines, the signals of the respective pixel rows are input to a column circuit 203. The column circuit 203 performs at least one of the following operations: signal retention, amplification, denoising, and analog-to-digital conversion. Then, in response to control pulses from a horizontal scanning circuit 204, the signals of the respective pixel rows are sequentially output to horizontal output lines, pass through an output unit 205 and an output pad 206, and are output to the outside of the image pickup device 102. In the present embodiment, the column circuit 203, the horizontal scanning circuit 204, the output unit 205, and the output pad 206 are arranged both above and below the pixel region 201. Each of the components arranged above and below the pixel region 201 operates to output signals from either even-numbered or odd-numbered columns of the pixel region 201 to the outside of the image pickup device 102. Both an image pickup signal and a phase difference detection signal (described below) pass through each of the above-described components and are output to the outside of the image pickup device 102.

Figure 3:
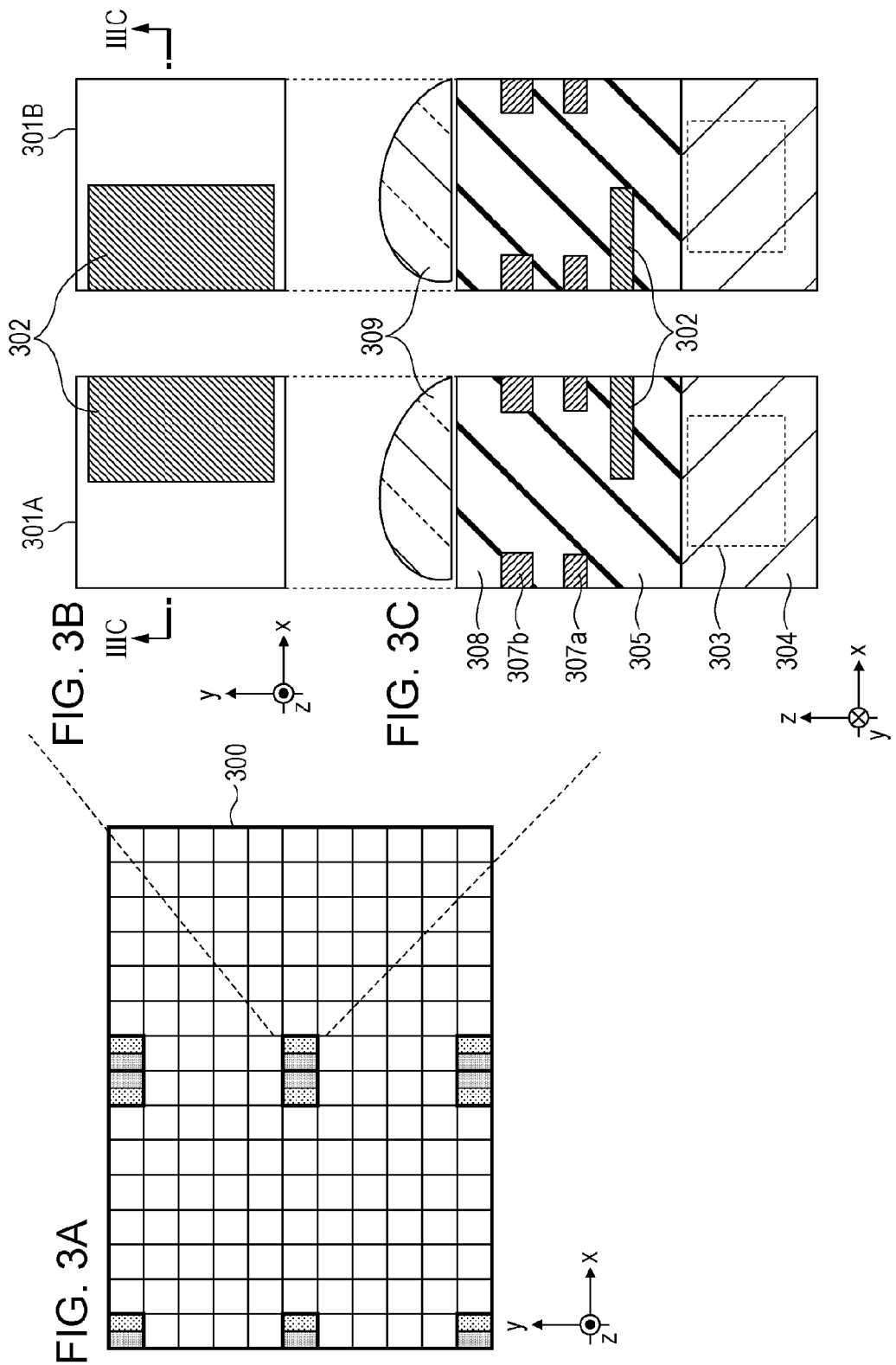
FIG. 3A is a top view of a pixel region of an image pickup device applicable to the present invention.
FIG. 3B is a top view of pixels arranged in the pixel region.
FIG. 3C illustrates a cross section of FIG. 3B.
Figure 4:
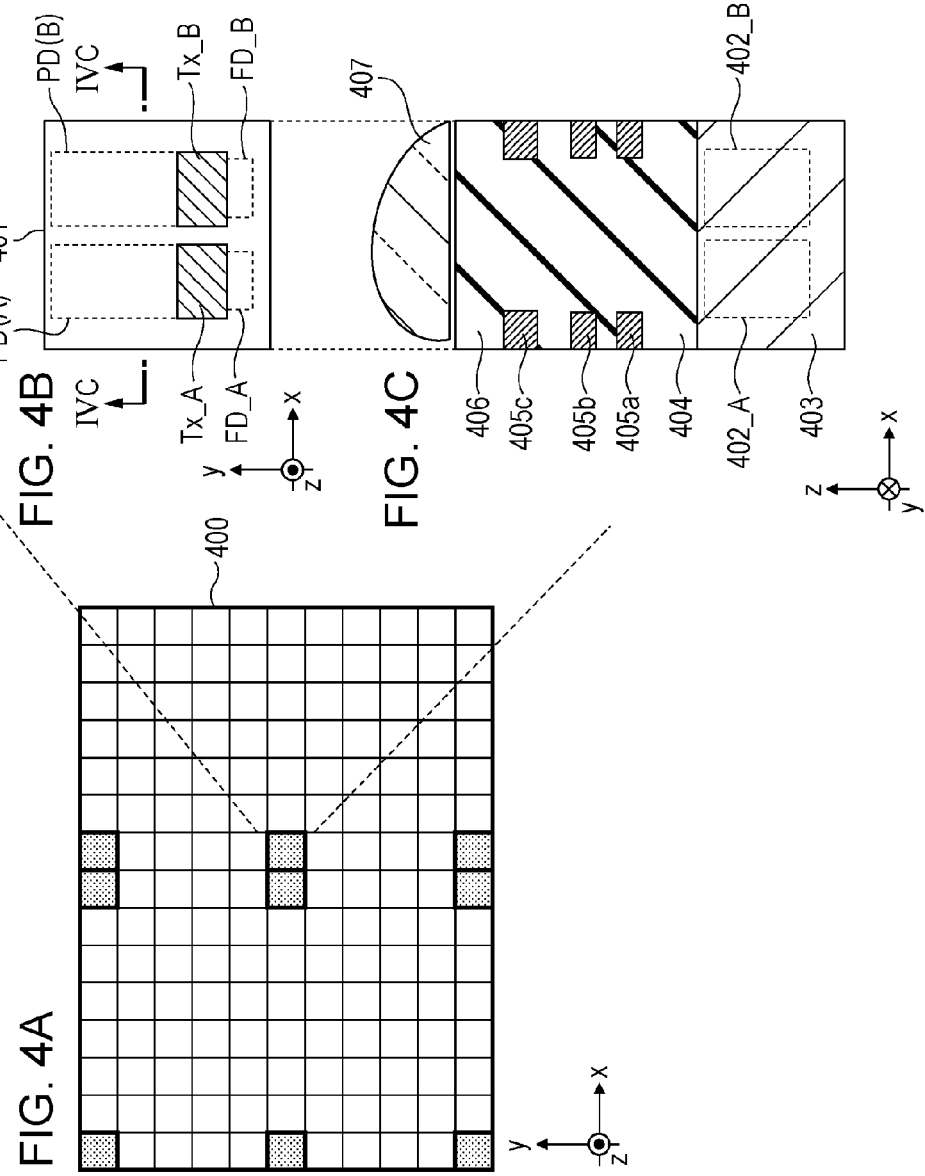
FIG. 4A is a top view of a pixel region of an image pickup device applicable to the present invention.
FIG. 4B is a top view of a pixel in the pixel region.
FIG. 4C illustrates a cross section of FIG. 4B.

Structures of focus detection pixels will now be described with reference to FIGS. 3A to 3C and FIGS. 4A to 4C. In FIGS. 3A to 3C, a photoelectric conversion unit of each pixel is provided with a light shielding member that shields part of the photoelectric conversion unit from light in plan view. In FIGS. 4A to 4C, each pixel includes a plurality of photoelectric conversion units, and signals from the plurality of photoelectric conversion units can be read out independently.

FIG. 3A is a plan view of a pixel region 300, FIG. 3B is a plan view of focus detection pixels arranged in the pixel region 300, and FIG. 3C illustrates a cross section taken along line IIIC-IIIC of FIG. 3B.

Focus detection pixels 301A and 301B and image pickup pixels are both arranged in the pixel region 300. The focus detection pixel 301A has an aperture on the left-hand side thereof in the drawing. That is, the focus detection pixel 301A has a light shielding member 302 on the right-hand side thereof in the drawing. The focus detection pixel 301B has an aperture on the right-hand side thereof in the drawing, and has the light shielding member 302 on the left-hand side thereof in the drawing.

Although the light shielding member 302 is formed by a single layer in this embodiment, the light shielding member 302 may be formed by a plurality of layers or by wiring.

The photoelectric conversion unit is formed by a photodiode that includes an N-type semiconductor region 303 and a P-type semiconductor region 304. The photoelectric conversion unit may be an embedded photodiode in which the N-type semiconductor region 303 is provided with a P-type semiconductor region on its front side.

An interlayer insulating film 305 is provided for electrical insulation between the light shielding member 302 and a wiring 307a and also between the wiring 307a and a wiring 307b. A predetermined layer 308 is disposed on the uppermost wiring 307*b*. The predetermined layer 308 is formed by at least one of a planarizing film, a color filter layer, a protective layer, and the like. A microlens 309 is disposed on the predetermined layer 308.

An image pickup pixel has the same structure as the focus detection pixel, except that it does not include the light shielding member 302. For distinction from other pixel structures, a focus detection pixel such as that described above will hereinafter be referred to as a focus detection pixel including a light shielding member. A plurality of focus detection pixels, each including a light shielding member, include a group of pairs of pupil-divided focus detection pixels. From signals output from the group of pairs of pupil-divided focus detection pixels, focus detection based on phase difference detection is performed. The light shielding member 302 is provided to receive light that passes through part of an exit pupil of an imaging optical system including the image pickup lens 101. In other words, the light shielding member 302 blocks light that passes through the other part of the exit pupil of the imaging optical system.

Next, the structure of another focus detection pixel will be described with reference to FIGS. 4A to 4C.

FIG. 4A is a plan view of a pixel region 400, FIG. 4B is a plan view of a focus detection pixel in the pixel region 400, and FIG. 4C illustrates a cross section taken along line IVC-IVC of FIG. 4B. In the structure illustrated in FIGS. 3A to 3C, both focus detection pixels and image pickup pixels are present in the imaging plane. In the structure illustrated in FIGS. 4A to 4C, every pixel serves both as a focus detection pixel and an image pickup pixel.

Differences from the structure illustrated in FIGS. 3A to 3C are that each pixel includes a plurality of photoelectric conversion units, and that signals from the photoelectric conversion units can be read out independently.

A plurality of pixels 401, each serving both as a focus detection pixel and an image pickup pixel, are arranged in the pixel region 400.

Each pixel 401 includes a photoelectric conversion unit (photodiode) PD(A) having an N-type semiconductor region 402_A and a P-type semiconductor region 403, and another photoelectric conversion unit (photodiode) PD(B) having an N-type semiconductor region 402_B and the P-type semiconductor region 403. The P-type semiconductor region 403 is interposed between the N-type semiconductor region 402_A and the N-type semiconductor region 402_B.

Each pixel 401 further includes a transfer gate electrode Tx_A that transfers a signal from the N-type semiconductor region 402_A to a floating diffusion FD_A, and a transfer gate electrode Tx_B that transfers a signal from the N-type semiconductor region 402_B to a floating diffusion FD_B.

Each of the floating diffusions FD_A and FD_B is connected to an input node of an amplification transistor (not shown). The floating diffusions FD_A and FD_B may be configured to be electrically connectable to each other so as to add up signals from the N-type semiconductor regions 402_A and 402_B in each pixel. Alternatively, the floating diffusions FD_A and FD_B may be arranged in a common active region.

Wirings 405*a* to 405*c* are electrically insulated from each other by an interlayer insulating film 404. A predetermined layer 406 is disposed on the uppermost wiring 405*c*. The predetermined layer 406 is formed by at least one of a planarizing film, a color filter layer, a protective layer, and the like. A microlens 407 is disposed on the predetermined layer 406.

For distinction from other pixel structures, a focus detection pixel such as that described above will hereinafter be referred to as a focus detection pixel including a plurality of photoelectric conversion units.

As described below, when the microlenses 309 and 407 of the present embodiment illustrated in FIGS. 3C and 4C are orthogonally projected onto the corresponding photoelectric conversion units, the highest positions (vertices) of the microlenses 309 and 407 are off the center positions thereof. Alternatively, the vertex position of the microlens 309 is off the center position of the photoelectric conversion unit of the corresponding pixel, and is off the center position in a direction towards the center of the pixel region 300 (e.g. in a left-hand direction in FIG. 3B). In the case of a focus detection pixel including a plurality of photoelectric conversion units, the vertex position of the microlens 407 is off the P-type semiconductor region 403 between the N-type semiconductor regions 402_A and 402_B of the corresponding pixel, and is towards the center of the pixel region 400.

When a normal microlens is orthogonally projected onto a photoelectric conversion unit, the vertex position of the microlens coincides with the center position thereof. That is, a normal microlens is symmetrical with respect to its vertex position. To clarify the difference from such a normal microlens, the microlenses illustrated in FIGS. 3C and 4C will hereinafter be referred to as asymmetrical microlenses. On the other hand, microlenses of related art will be referred to as symmetrical microlenses. The structure of an asymmetrical microlens will be described in detail later on.

Figure 5:
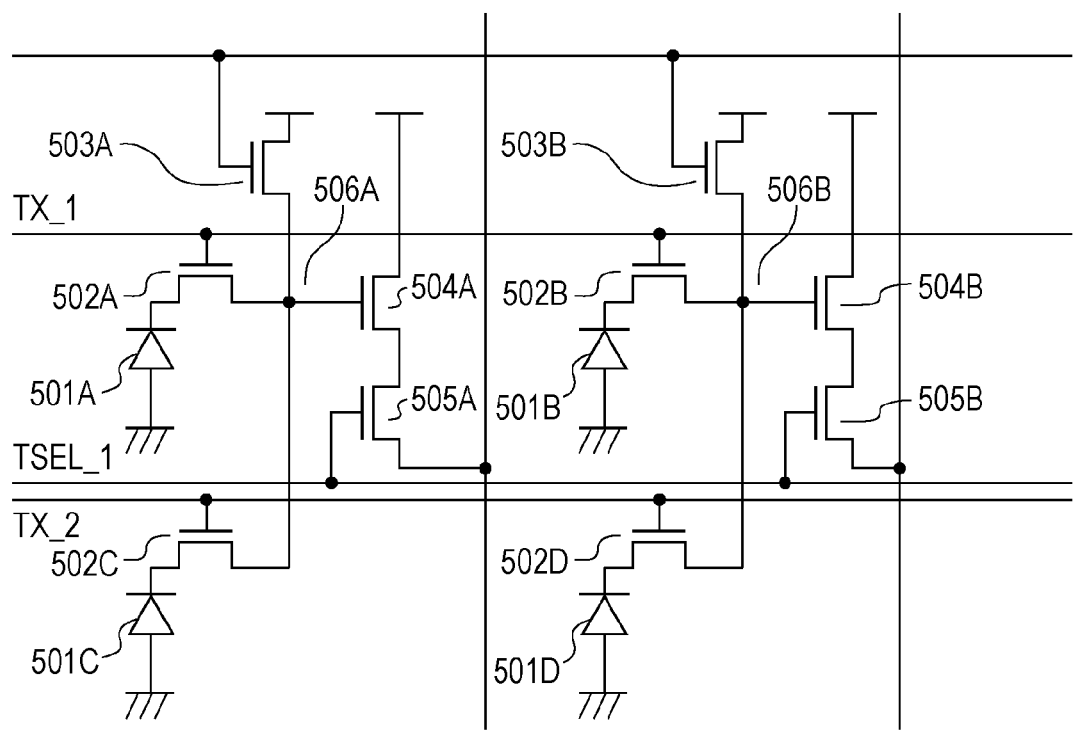
FIG. 5 is an equivalent circuit diagram of a pixel circuit applicable to the present invention.
Figure 6:
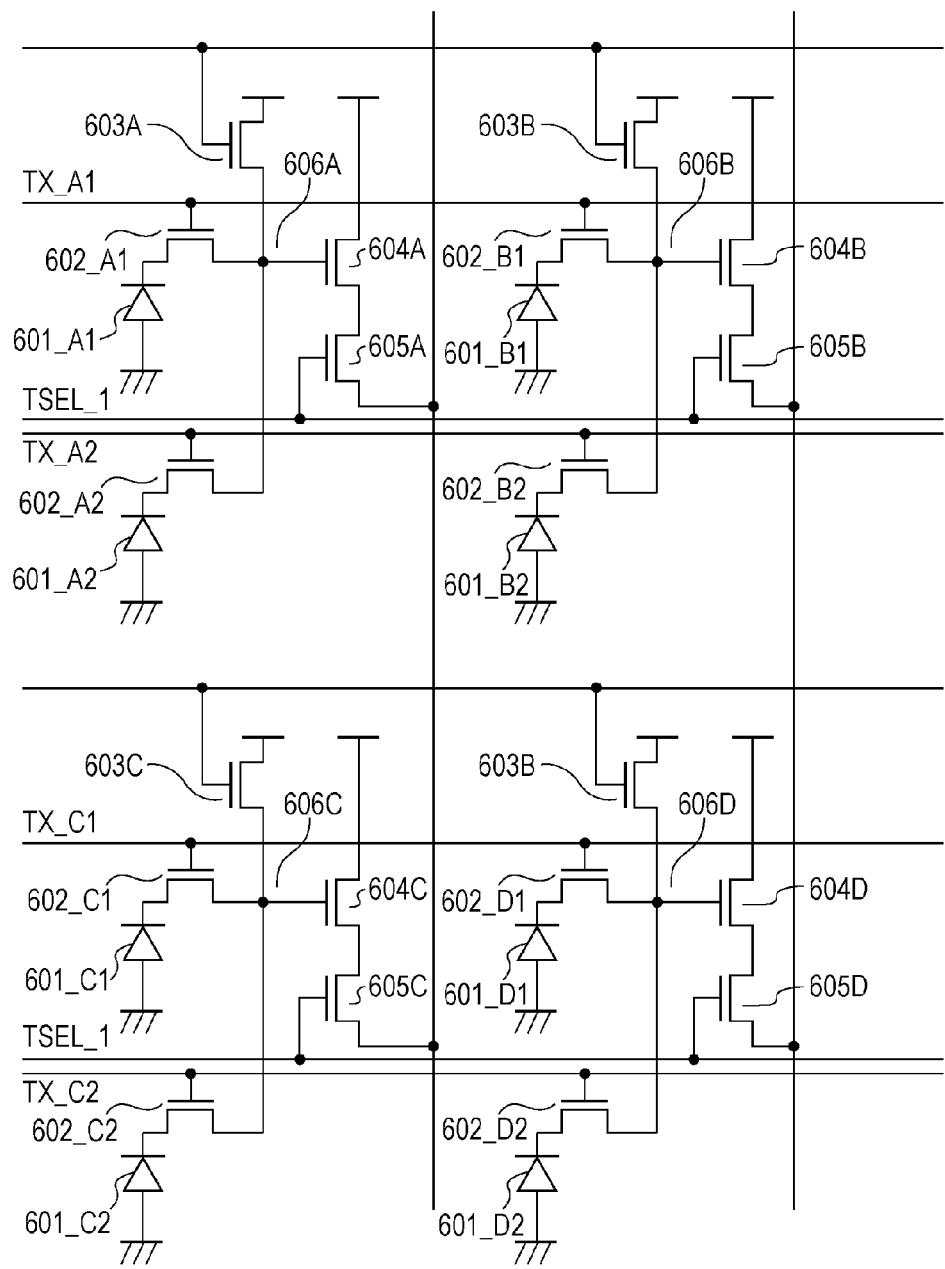
FIG. 6 is an equivalent circuit diagram of a pixel circuit applicable to the present invention.

With reference to FIGS. 5 and 6, equivalent circuits of pixels of the image pickup devices described with reference to FIGS. 3A to 3C and FIGS. 4A to 4C will now be described. FIGS. 5 and 6 each illustrate a total of four pixels arranged in an array of two rows and two columns.

FIG. 5 illustrates an equivalent circuit of the image pickup device corresponding to FIGS. 3A to 3C. Although characters are added to the ends of reference numbers to identify rows and columns, operations common to all the pixels will be described without adding characters. Operations unique to each pixel row or column will be described by adding characters as needed.

In FIG. 5, the pixels in the first row are focus detection pixels, and the pixels in the second row are image pickup pixels. Since signals of focus detection pixels and normal image pickup pixels can be read out in the same reading method, these pixels will be described without distinction therebetween.

First, a basic signal reading operation will be described. Charges generated in a photoelectric conversion unit 501 are transferred through a transfer transistor 502 to a floating diffusion 506. The floating diffusion 506 is connected to the gate of an amplification transistor 504, which amplifies a signal based on the transferred charges. The amplified signal is output through a selection transistor 505 to a signal output line. Then, the charges transferred to the floating diffusion 506 are reset by a reset transistor 503.

In this embodiment, two pixels share the reset transistor 503, the amplification transistor 504, and the selection transistor 505.

Figure 2:
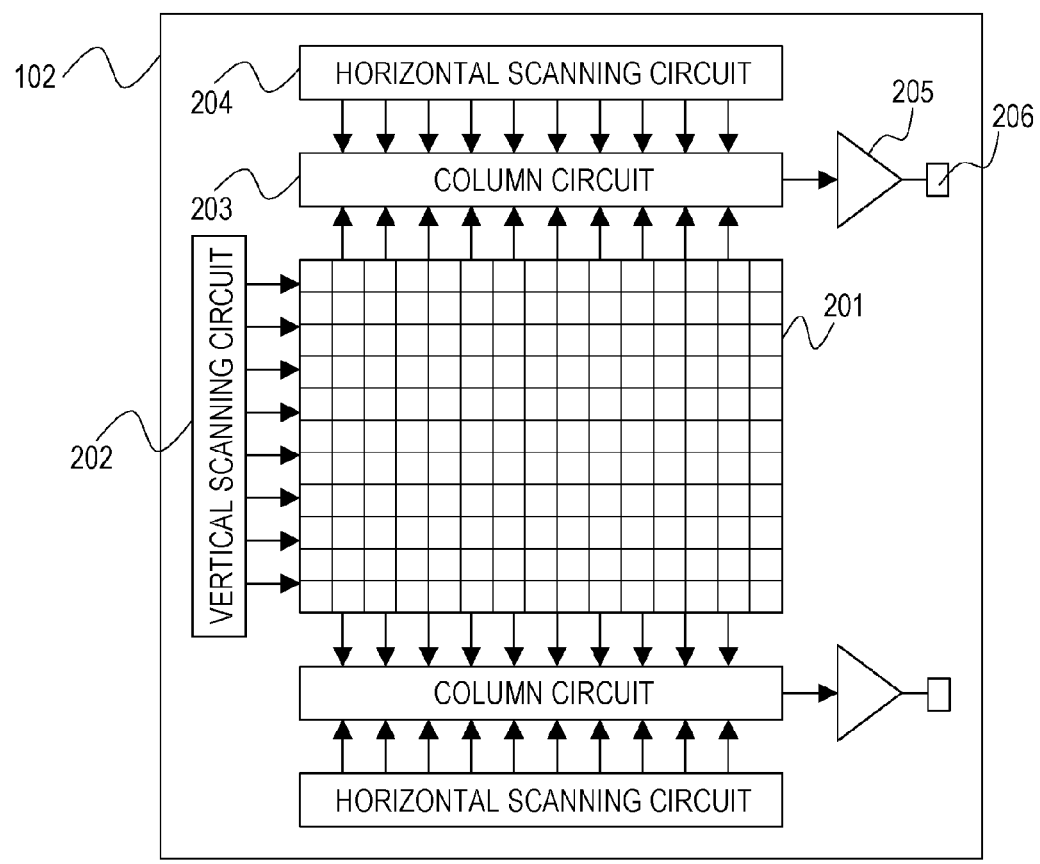
FIG. 2 is a general block diagram of an image pickup device applicable to the present invention.

The column circuits 203 described with reference to FIG. 2 are provided in the subsequent stage of the signal output lines. Predetermined processing is performed in the column circuits 203.

Signals of a plurality of pixels contained in each row are output to the corresponding signal output lines. In response to a drive signal supplied to a transfer control line TX_1, transfer transistors 502A and 502B of respective pixels in the first row are substantially simultaneously turned on. This causes charges in photoelectric conversion units 501A and 501B in the first row to be transferred to floating diffusions 506A and 506B. When a selection control line TSEL_1 is turned on, selection transistors 505A and 505B in the first row are turned on, so that signals of the pixels in the first and second columns are output to the signal output lines. A frame of image signals is read out by repeating this operation for all the rows.

Signals from focus detection pixels and signals from image pickup pixels can be output to the outside of the image pickup device without distinction. The signals from focus detection pixels are extracted from the output signals, so that focus detection based on a phase difference can be performed.

Alternatively, signals from image pickup pixels and signals from focus detection pixels may be output for different frames.

With reference to FIG. 6, the image pickup device of FIGS. 4A to 4C will be described. Although characters are added to the ends of reference numbers to identify rows and columns, operations common to all the pixels will be described without adding characters. Operations unique to each pixel row or column will be described by adding characters as needed.

In the image pickup device illustrated in FIGS. 4A to 4C, each pixel includes a plurality of photoelectric conversion units, from which signals can be read out independently. For example, the first pixel includes photoelectric conversion units 601_A1 and 601_A2, for which transfer transistors 602_A1 and 602_A2, respectively, are provided. Because of control through transfer control lines TX_A1 and TX_A2 which are different control wirings, signals from the photoelectric conversion units 601_A1 and 601_A2 can be read out independently.

A basic signal reading operation will be described. Charges generated in a photoelectric conversion unit 601 are transferred through a transfer transistor 602 to a floating diffusion 606. The floating diffusion 606 is connected to the gate of an amplification transistor 604, which amplifies a signal based on the transferred charges. The amplified signal is output through a selection transistor 605 to a signal output line. Then, the charges transferred to the floating diffusion 606 are reset by a reset transistor 603.

In this embodiment, two photoelectric conversion units included in each pixel share the reset transistor 603, the amplification transistor 604, and the selection transistor 605.

The column circuits 203 described with reference to FIG. 2 are provided in the subsequent stage of the signal output lines. Predetermined processing is performed in the column circuits 203.

Signals of a plurality of pixels contained in each row are output to the corresponding signal output lines. In response to a drive signal supplied to the transfer control line TX_A1, signals of the photoelectric conversion units 601_A1 and 601_B1 of the pixels in the first row are read out. The transfer transistors 602_A1 and 602_B1 are simultaneously turned on. This causes charges in the photoelectric conversion units 601_A1 and 601_B1 to be transferred to floating diffusions 606A and 606B. When a selection control line TSEL_1 is turned on, selection transistors 605A and 605B in the first row are simultaneously turned on, and the signals of the pixels in the first and second columns are simultaneously output to the signal output lines. Then in response to a drive signal supplied to the transfer control line TX_A2, signals of the other photoelectric conversion units 601_A2 and 601_B2 of the pixels in the first row are read out. Transfer transistors 602_A2 and 602_B2 are simultaneously turned on. This causes charges in the photoelectric conversion units 601_A2 and 601_B2 to be transferred to the floating diffusions 606A and 606B. When the selection control line TSEL_1 is turned on, the selection transistors 605A and 605B in the first row are turned on, and the signals of the pixels in the first and second columns are output to the signal output lines. A screen of image signals is read out by repeating this operation for all the rows.

In the image pickup device of this embodiment, basically every pixel serves both as a focus detection pixel and an image pickup pixel. Therefore, it is possible to appropriately select a necessary region and a necessary number of pixels from the imaging plane and output them to the outside of the image pickup device. Also, it is possible to extract signals of focus detection pixels from output signals and perform focus detection based on a phase difference.

An asymmetrical microlens used in an image pickup device of the present invention will now be described.

Before description of the asymmetrical microlens, a structure using a symmetrical microlens will be described as a comparative example.

Figure 7A:
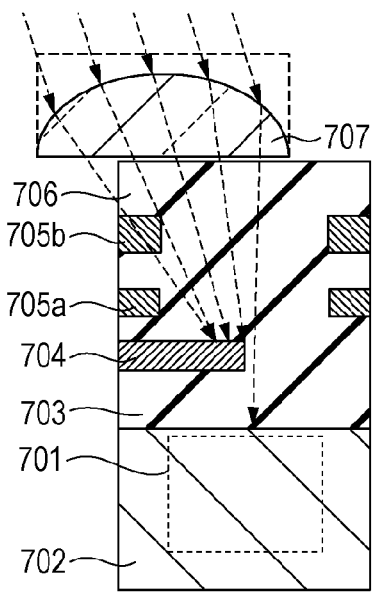
FIGS. 7A and 7B each illustrate a pixel provided with a symmetrical microlens of a comparative example.
Figure 7B:
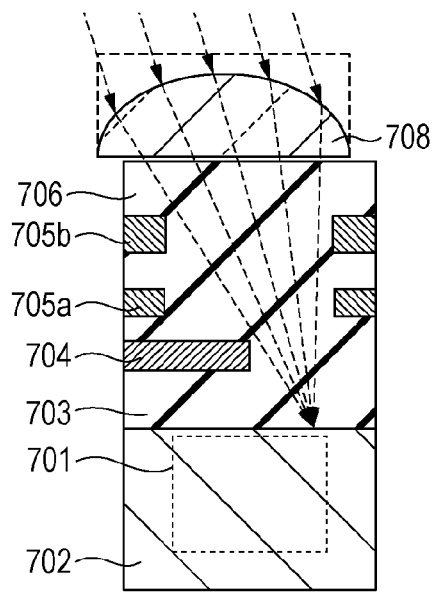
Figure 8A:
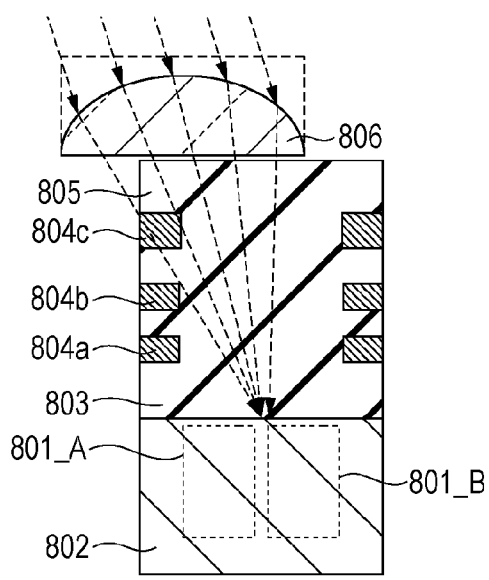
FIGS. 8A and 8B each illustrate a pixel provided with a symmetrical microlens of a comparative example.
Figure 8B:
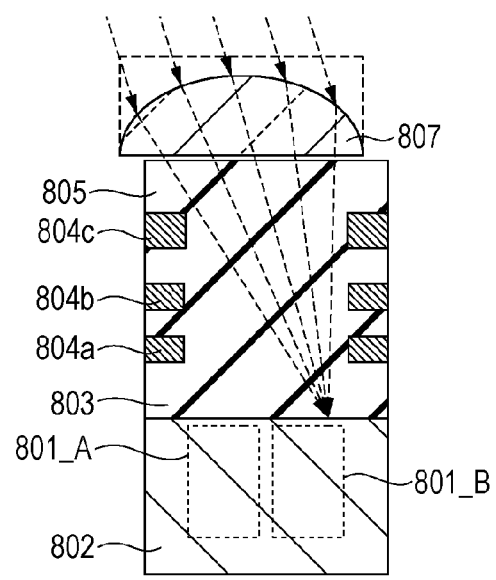

FIGS. 7A and 7B each illustrate a comparative example of the image pickup device described with reference to FIGS. 3A to 3C and FIG. 5. FIGS. 8A and 8B each illustrate a comparative example of the image pickup device described with reference to FIGS. 4A to 4C and FIG. 6. The symmetrical microlens refers to a microlens which has its highest point at the center thereof in plan view. The microlenses illustrated FIGS. 7A and 7B and FIGS. 8A and 8B have the same shape.

An oblique incidence characteristic is generally known as a characteristic of image pickup devices. This is a characteristic that indicates to what degree light obliquely incident on the imaging plane can be collected onto the photoelectric conversion unit. A method of improving the oblique incidence characteristic is known, in which the center of the microlens is displaced from the center of the photoelectric conversion unit.

In FIGS. 7A and 7B and FIGS. 8A and 8B, the amount of displacement of the symmetrical microlens is varied to improve both sensitivity and focus detection performance. The amount of displacement in FIG. 7A is larger than the amount of displacement in FIG. 7B, and the amount of displacement in FIG. 8A is larger than the amount of displacement in FIG. 8B.

In FIG. 7A, an N-type semiconductor region 701 and a P-type semiconductor region 702 form a photodiode serving as a photoelectric conversion unit. An interlayer insulating film 703 is disposed on the photoelectric conversion unit. A light shielding member 704 shields part of the N-type semiconductor region 701 from light. Wirings 705a and 705b are insulated from each other by the interlayer insulating film 703. A predetermined layer 706 (e.g., color filter) is disposed on the wiring 705b which is the uppermost wiring layer. A microlens 707 is disposed on the upper side of the predetermined layer 706. The basic structure in FIG. 7B is the same as that in FIG. 7A. The position of a microlens 708 relative to the N-type semiconductor region 701 in FIG. 7B is different from the position of the microlens 707 relative to the N-type semiconductor region 701 in FIG. 7A.

In the structure illustrated in FIG. 7A, light collected by the microlens 707 onto a region to the left of the center of the N-type semiconductor region 701 is blocked by the light shielding member 704. Therefore, focus detection performance achieved in the structure of FIG. 7A is high. However, in the case of generating a signal for image pickup using this pixel, there is room for improvement in terms of sensitivity, because a large amount of light is blocked by the light shielding member 704.

In the structure illustrated in FIG. 7B, in the entire region of the microlens 708 corresponding to the N-type semiconductor region 701, light is incident on the photoelectric conversion unit without being blocked by the light shielding member 704. Therefore, sensitivity achieved in this structure is higher than that in FIG. 7A. However, light which is to be originally blocked by the light shielding member 704 is also incident on the photoelectric conversion unit. Specifically, light incident on the left-hand side of the microlens 708 which should be blocked by the light shielding member 704 for focus detection, is instead incident on the photoelectric conversion unit without being blocked. Therefore, although the structure of FIG. 7B is preferable to that of FIG. 7A in terms of sensitivity, there is room for improvement in terms of focus detection accuracy.

That is, in the structures of both FIGS. 7A and 7B, some improvement needs to be made to achieve both focus detection accuracy and sensitivity.

In FIG. 8A, an N-type semiconductor region 801_A and a P-type semiconductor region 802, and an N-type semiconductor region 801_B and the P-type semiconductor region 802 form two photodiodes each serving as a photoelectric conversion unit. An interlayer insulating film 803 is disposed on the two photoelectric conversion units. Wirings 804a to 804c are insulated from each other by the interlayer insulating film 803. A predetermined layer 805 (e.g., color filter) is disposed on the wiring 804c which is the uppermost wiring layer. A microlens 806 is disposed on the upper side of the predetermined layer 805. The basic structure in FIG. 8B is the same as that in FIG. 8A. The position of a microlens 807 relative to the N-type semiconductor regions 801_A and 801_B in FIG. 8B is different from the position of the microlens 806 relative to the N-type semiconductor regions 801_A and 801_B in FIG. 8A.

In the structure of FIG. 8A, the region between the N-type semiconductor region 801_A and the N-type semiconductor region 801_B is at the center of the pixel. Light collected by the microlens 806 onto a region to the left of the center is incident on the region between the N-type semiconductor region 801_A and the N-type semiconductor region 801_B. Then, a relatively large number of charges are generated and signals are read out through the N-type semiconductor region 801_B. Therefore, focus detection accuracy achieved in the structure of FIG. 8A is high. However, in the case of generating a signal for image pickup using this pixel, there is room for improvement in terms of sensitivity, because a large amount of light is blocked by the wirings 804a to 804c.

In the structure illustrated in FIG. 8B, light collected by the microlens 807 is incident on the photoelectric conversion unit without being blocked by the wirings 804a to 804c. Therefore, sensitivity achieved in this structure is higher than that in FIG. 8A. However, since light is incident on a region closer to the N-type semiconductor region 801_B, there is room for improvement in terms of focus detection accuracy.

That is, in the structures of both FIGS. 8A and 8B, some improvement needs to be made to achieve both focus detection accuracy and sensitivity.

Next, an image pickup device according to an embodiment of the present invention will be described. An asymmetrical microlens is used in the present embodiment. Using an asymmetrical microlens can increase the degree of freedom in setting a focus position in the photoelectric conversion unit.

In the case of using a symmetrical microlens as in the comparative examples, it is difficult, without moving the entire microlens, to change the planar position of the focus while keeping the position of the focus in the depth direction. In contrast, using an asymmetrical microlens makes it possible to change the planar position of the focus without significantly changing the position of the focus in the depth direction. Therefore, using an asymmetrical microlens makes it possible to achieve both focus detection accuracy and sensitivity regardless of the planar layout of semiconductor regions forming the photoelectric conversion unit, wirings made of polysilicon or metal, the light shielding member, or the like.

For the asymmetrical microlens of the present embodiment, it is only necessary that at least the highest point of the microlens be off the center position thereof in plan view. With this structure, the planar position of the focus can be changed easily.

Besides this structure, an asymmetrical microlens structure that can increase the occupancy area of the microlens will be described.

Figure 9A:
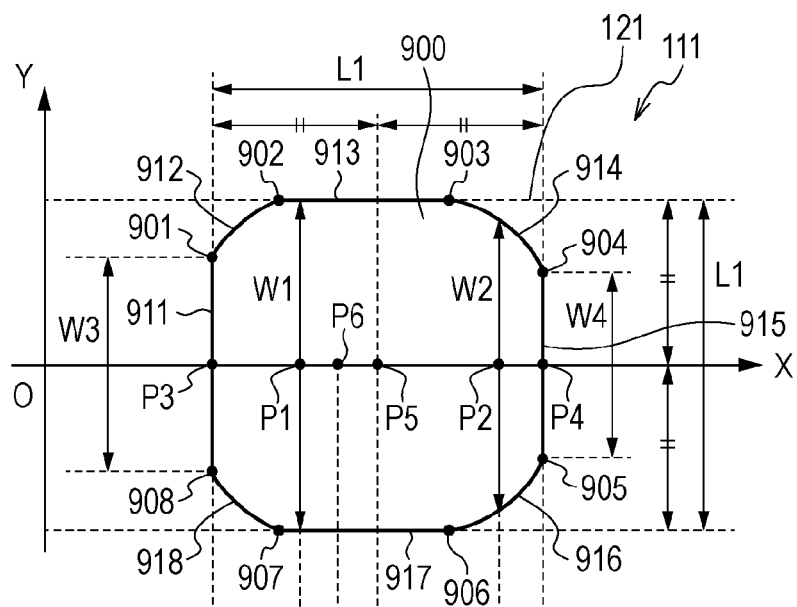
FIG. 9A is a top view of an asymmetrical microlens according to an embodiment of the present invention.
Figure 9B:
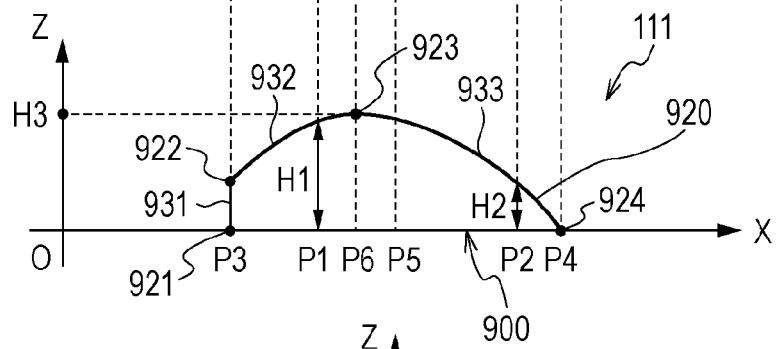
FIGS. 9B and 9C are cross-sectional views of the asymmetrical microlens in FIG. 9A.
Figure 9C:
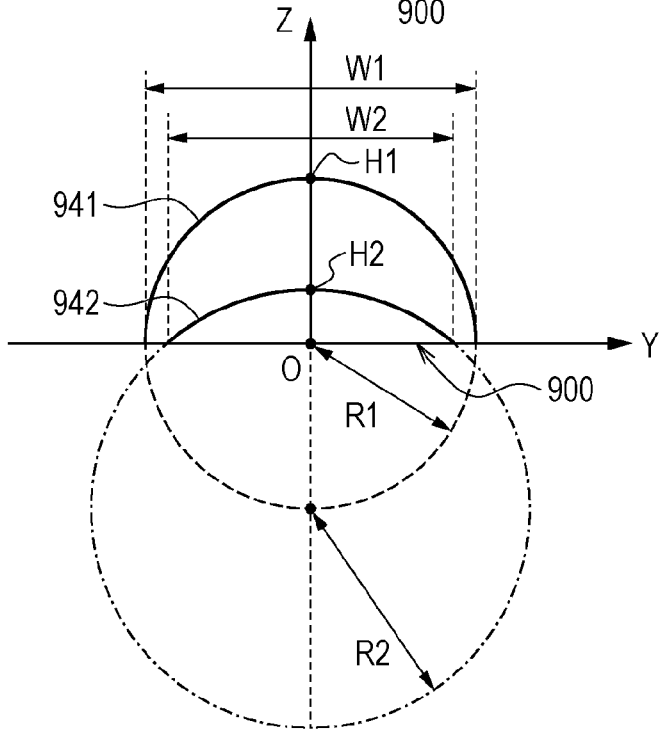

An asymmetrical microlens of the present embodiment will be described with reference to FIGS. 9A to 9C. FIG. 9A is a schematic plan view of an asymmetrical microlens 111. FIGS. 9B and 9C are schematic cross-sectional views of the asymmetrical microlens 111.

FIG. 9A is a schematic plan view illustrating a bottom part 900 of the asymmetrical microlens 111 in a plane containing the X-axis direction and the Y-axis direction. The bottom part 900 coincides with the shape of an image (orthogonal projection image) obtained by projecting the asymmetrical microlens 111 onto the plane containing the X-axis direction and the Y-axis direction. In the bottom part 900, the asymmetrical microlens 111 has a first length L1 along the X-axis direction, and also has the first length L1 along the Y-axis direction. In the case of a structure where there is no gap between adjacent microlenses, the bottom 900 is defined at a microlens height at which adjacent microlenses are in contact with each other.

Within the bottom part 900 (asymmetrical microlens 111), there are a first position P1 to a sixth position P6 along the X-axis direction. The third position P3, the first position P1, the sixth position P6, the fifth position P5, the second position P2, and the fourth position P4 are arranged in this order from a center O of an array region.

In the outer edge of the bottom part 900 of the asymmetrical microlens 111, a side 911 of a first region 121, the side 911 being closest to the center O and extending along the Y-axis direction, is located at the third position P3. In the outer edge of the bottom 900 of the asymmetrical microlens 111, a side 915 of the first region 121, the side 915 being most distant from the center O and extending along the Y-axis direction, is located at the fourth position P4. The center of the bottom 900 of the asymmetrical microlens 111 is located at the fifth position P5, which is the center between the third position P3 and the fourth position P4. That is, the fourth position P4 is distant by the first length L1 from the third position P3, and the fifth position P5 is distant by half the first length L1 (L1/2) from the third position P3. As described below, the sixth position P6 indicates the position of the vertex of the asymmetrical microlens 111 in the X-axis direction. The first region 121 is one of cells arranged in a two-dimensional matrix in the array region. Each of the cells is provided with one microlens.

As illustrated in FIG. 9A, the bottom part 900 is vertically symmetrical with respect to the X-axis, and its outer edge is formed by the sides 911 to 918. The side 911 is a straight line connecting a point 901 to a point 908, and the side 912 is a curve connecting the point 901 to a point 902. The side 913 is a straight line connecting the point 902 to a point 903, and the side 914 is a curve connecting the point 903 to a point 904. The side 915 is a straight line connecting the point 904 to a point 905, and the side 916 is a curve connecting the point 905 to a point 906. The side 917 is a straight line connecting the point 906 to a point 907, and the side 918 is a curve connecting the point 907 to the point 908. The sides 911 and 915 are straight lines extending along the Y-axis direction. The sides 913 and 917 are straight lines extending along the X-axis direction. The sides 912, 914, 916, and 918 each have a curvature and provide a connection between straight lines.

At the first position P1 along the X-axis direction, the bottom part 900 has a first width W1 along the Y-axis direction. At the second position P2 along the X-axis direction, the bottom part 900 has a second width W2 along the Y-axis direction. At the third position P3 and the fourth position P4, the bottom 900 has a third width W3 and a fourth width W4, respectively, which are along the Y-axis direction. At least the relationship W1>W2 is satisfied, and it is more preferable that the relationship W1>W2>W3>W4 be satisfied. Note that W1=L1 is satisfied in FIG. 9A.

The first position P1 is any position at a distance of half the first length L1 or less from the third position P3, and the second position P2 is any position at a distance of more than half the first length L1 from the third position P3. The first position P1 may be any position at a distance of less than half the first length L1 from the third position P3, and the second position P2 may be any position at a distance of half the first length L1 or more from the third position P3. The distance from the center O to the second position P2 is larger than that from the center O to the first position P1.

FIG. 9B is a schematic cross-sectional view of the asymmetrical microlens 111 along the X-axis in FIG. 9A. In a plane containing the Z-axis direction and the X-axis direction, sides 931 to 933 form the outer edge of a cross section 920 of the asymmetrical microlens 111. The side 931 is a straight line connecting a point 921 to a point 922, the side 932 is a curve connecting the point 922 to a point 923, and the side 933 is a curve connecting the point 923 to a point 924. The asymmetrical microlens 111 has a first height H1 at the first position P1, a second height H2 at the second position P2, and a third height H3 at the sixth position P6. These heights have the relationship H3>H1>H2. Here, the third height H3 is highest in the asymmetrical microlens 111. In other words, the point 923 at the sixth position P6 is the vertex of the asymmetrical microlens 111. The asymmetrical microlens 111 has its vertex at the sixth position P6 which is closer to the center O than the fifth position P5 is. Here, the vertex is the highest point in the cross section 920. Although the asymmetrical microlens 111 has the vertex in the present embodiment, the highest portion does not necessarily need to be a point. For example, the asymmetrical microlens 111 may have the third height H3 at any point along the line from the first position P1 to the fifth position P5.

As illustrated in FIG. 9B, the side 932 of the asymmetrical microlens 111 has a portion with a curvature radius smaller than that of the side 933. The side 932 may have a portion with a curvature radius larger than that of the side 933. With this structure, light incident from the side 933 is significantly bent by high lens power and the light collecting efficiency is improved. The curvature radius can be determined, for example, from a tangent at any point in a cross section of the asymmetrical microlens 111. For example, a tangent to the side 933 at the center of the side 933 in the X-axis direction (i.e., the center between the sixth position P6 and the fourth position P4) is determined. The curvature radius can be obtained from an inscribed circle of the tangent. Other methods generally used to measure the curvature radius may be used to determine the curvature radius of each part.

FIG. 9C shows cross sections of the asymmetrical microlens 111 at the first position P1 and the second position P2 in FIG. 9A. A first cross section 941 is a cross section of the asymmetrical microlens 111 taken at the first position P1 in the FIG. 9A along the Y-axis direction. A second cross section 942 is a cross section of the asymmetrical microlens 111 taken at the second position P2 in the FIG. 9A along the Y-axis direction. In the first cross section 941, the asymmetrical microlens 111 has the first width W1 and the first height H1, which is highest and corresponds to the vertex of the first cross section 941. The outer edge of the first cross section 941 has a first curvature radius R1. In the second cross section 942, the asymmetrical microlens 111 has the second width W2 and the second height H2, which is highest and corresponds to the vertex of the second cross section 942. Although the asymmetrical microlens 111 has these vertices in the present embodiment, the portions having the first height H1 and the second height H2 do not necessarily need to be points, as described above.

The outer edge of the second cross section 942 has a second curvature radius R2. The first and second curvature radii R1 and R2 have the relationship R1<R2. This relationship may be R1≥R2, but the second width W2 may be narrowed and the area occupancy ratio may be lowered. In this case, the second width W2 of the asymmetrical microlens 111 may form the outer edge in FIG. 9A. When the asymmetrical microlens 111 has a side with a length equal to the second width W2 at the position most distant from the center O, it is possible to increase the area occupancy ratio and bring in light from a broader range.

As illustrated in FIGS. 9A to 9C, the asymmetrical microlens 111 has the first width W1, the first height H1, and the first curvature radius R1 at the first position P1, and has the second width W2, the second height H2, and the second curvature radius R2 at the second position P2. Satisfying the relationships W1>W2, H1>H2, and R1<R2 allows the asymmetrical microlens 111 to have a large occupancy area while keeping high light-collecting capability, so that the light collecting ratio can be improved.

Next, a comparison between the asymmetrical microlens 111 and a symmetrical microlens 1011 of related art will be made with reference to FIGS. 10A to 10D. The same parts as those in FIGS. 9A to 9C are denoted by the same reference numerals, and their detailed description will be omitted.

Figure 10A:
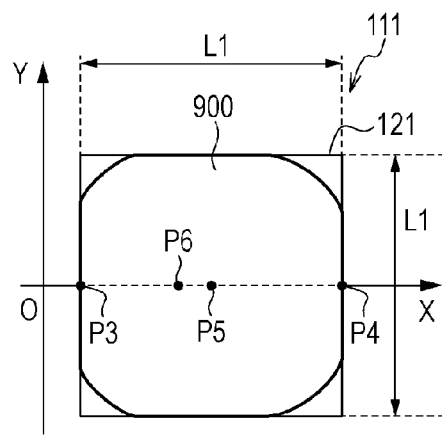
FIGS. 10A to 10D compare the asymmetrical microlens according to the embodiment of the present invention with a symmetrical microlens of related art.
Figure 10B:
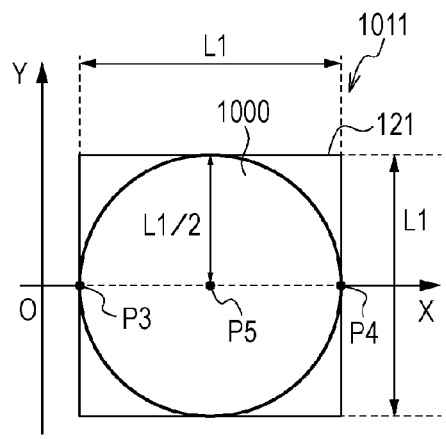
Figure 10C:
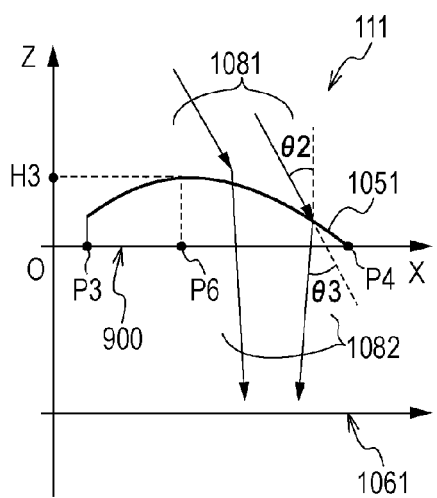
Figure 10D:
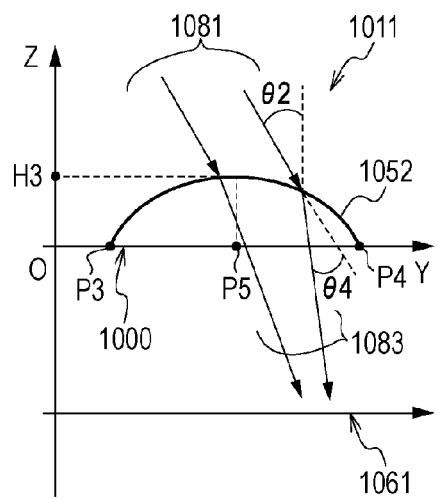

FIG. 10A is a schematic plan view illustrating the bottom 900 of the asymmetrical microlens 111, and FIG. 10B is a schematic plan view illustrating a bottom 1000 of the symmetrical microlens 1011 for comparison. FIG. 10C is a schematic cross-sectional view of the asymmetrical microlens 111, and FIG. 10D is a schematic cross-sectional view of the symmetrical microlens 1011 for comparison.

In FIGS. 10A to 10D, the microlenses are positioned in the respective first regions 121 having the same area.

As illustrated in FIG. 10B, the symmetrical microlens 1011 has the bottom 1000. The bottom 1000 is in the shape of a circle having a radius which is half the first length L1 (L1/2). As illustrated in FIG. 10B, the vertex of the symmetrical microlens 1011 is located at the fifth position P5 which is the center of the first region 121.

FIG. 10C is a schematic cross-sectional view illustrating a cross section 1051 of the asymmetrical microlens 111 along the X-axis in FIG. 10A. FIG. 10D is a schematic cross-sectional view illustrating a cross section 1052 of the symmetrical microlens 1011 along the X-axis in FIG. 10B. Both of the microlenses have the third height H3 at their vertices. FIGS. 10C and 10D each provide a virtual incidence plane 1061 equidistant from the corresponding bottom to show the behavior of light in the microlens. Oblique light 1081 having an angle θ2 from the normal to the light receiving surface of each of the microlenses is incident on the microlens.

The light 1081 incident on the symmetrical microlens 1011 becomes, for example, light 1083 having an angle θ4 from the light 1081 and is collected. On the other hand, the light 1081 incident on the asymmetrical microlens 111 becomes, for example, light 1082 having an angle θ3 from the light 1081 and is collected. The angle θ3 is larger than the angle θ4. As shown in the cross section 1051 of FIG. 10C, the asymmetrical microlens 111 gradually changes its slopes on both sides of the sixth position P6, and light is refracted in different ways on both sides of the sixth position P6. In the present embodiment, the curvature radius at the first position P1 is smaller than the curvature radius at the second position P2. At a point close to the fourth position P4, the asymmetrical microlens 111 can turn obliquely incident light (angle θ2) into light along the Z-axis direction (angle θ3), and can more effectively collect obliquely incident light than the symmetrical microlens 1011. When the angle θ2 ranges from 20 degrees to 40 degrees, the sensitivity of pixels using the asymmetrical microlens 111 is 10% to 20% higher than that of pixels using the symmetrical microlens 1011.

The asymmetrical microlens 111 has a large occupancy area while keeping high light-collecting capability, and thus has a high light-collecting ratio. Therefore, by providing at least one asymmetrical microlens 111 at a predetermined distance from the center O of the array region, it is possible to provide a microlens array having a high light-collecting ratio.

Since the second position P2 (FIG. 9A) may be any position that satisfies the conditions described above, the second position P2 may be the fourth position P4. That is, the side 915 may have the second width W2 as its length. In this case, the asymmetrical microlens 111 can have a larger occupancy area than that described above.

The asymmetrical microlens 111 may have the vertex at the first position P1. That is, the sixth position P6 may be at the same location as the first position P1. The first width W1 at the first position P1 is the largest width in the present embodiment. However, the asymmetrical microlens 111 may have the largest width at a different position, or more specifically, between the fifth position P5 and the second position P2. The asymmetrical microlens 111 having the largest width at such a position can have a higher area occupancy ratio.

The first region 121 has a square shape in the present embodiment. However, the first region 121 may be in the shape of any rectangle that circumscribes the outer edge of the asymmetrical microlens 111 in plan view. The first region 121 may be in the shape of a rectangle having sides with the first length L1. A plurality of microlenses may be arranged at least one-dimensionally. The third width W3 at the third position P3 may be equal to the first length L1 (W3=L1).

In the present embodiment, the first length L1 ranges from 0.5 µm to 50 µm. The first width W1 and the second width W2 range from 0.5 µm to 50 µm. The ratio of the second width W2 to the first width W1 ranges from 0.05 to 0.99 and preferably from 0.2 to 0.8. The first height H1 and the second height H2 range from 0.1 µm to 5.0 µm. The first curvature radius R1 is determined by the first height H1 and the first width W1, and the second curvature radius R2 is determined by the second height H2 and the second width W2. The first curvature radius R1 and the second curvature radius R2 range from about 0.25 µm to about 100 µm. The widths, heights, and curvature radii of the asymmetrical microlens may be appropriately set to achieve an area occupancy ratio of 80% or more. This is because, for example, if the area occupancy ratio of asymmetrical microlenses in the image pickup device is less than 80%, at least 20% of light cannot be collected, and this leads to noticeable shading around an image.

The asymmetrical microlens of the present embodiment can be formed, for example, using a photolithography technique. In this case, a photoresist is exposed to light by an exposure apparatus which uses an area gradation mask or gray tone mask having a transmittance determined from design data for the shape of the asymmetrical microlens. The photoresist is then developed to form a desired asymmetrical microlens.

When there is a degree of design freedom in terms of microlens occupancy area, the contour of the asymmetrical microlens may be formed by a curved shape gradually narrowed in the radial direction in plan view and a curved shape gradually lowered in the radial direction in cross-sectional view.

An asymmetrical microlens has been described. In related art, no studies have been carried out to apply an asymmetrical microlens to an image pickup device capable of phase difference detection in the imaging plane (hereinafter referred to as an image-plane autofocus (AF) image pickup device). Studies done by the present inventors have shown that the focus position in plan view can be freely changed by using an asymmetrical microlens, and have also shown that in an image-plane AF image pickup device, it is possible both to maintain sensitivity and to improve focus detection accuracy.

With reference to FIGS. 11A to 11D, a description is given of how light is collected when an asymmetrical microlens of the present invention is applied to a focus detection pixel.

FIG. 11A is a top view of an image pickup device. An image pickup device 1100 includes a pixel region 1101 and a peripheral circuit region around the pixel region 1101. At least one of a scanning circuit, an amplification circuit, and an analog-to-digital circuit is provided in the peripheral circuit region. A target pixel 1102 is located in an outer part of the pixel region 1101. FIGS. 11B to 11D each illustrate a cross-sectional structure of the target pixel 1102. FIG. 11B illustrates an example where the target pixel 1102 is an image pickup pixel. A photoelectric conversion unit is formed by a photodiode including an N-type semiconductor region 1103 and a P-type semiconductor region 1104. The photoelectric conversion unit may be an embedded photodiode in which the N-type semiconductor region 1103 is provided with a P-type semiconductor region on its front side. Charges in the N-type semiconductor region 1103 are transferred by a transfer gate electrode Tx to a floating diffusion FD. Wirings 1106a to 1106c are electrically insulated from each other by an interlayer insulating film 1105. A predetermined layer 1107 is disposed on the uppermost wiring 1106c. The predetermined layer 1107 is formed by at least one of a planarizing film, a color filter layer, a protective layer, and the like. A microlens 1108 is disposed on the predetermined layer 1107.

FIGS. 11C and 11D each illustrate an example where the target pixel 1102 is a focus detection pixel. FIG. 11C illustrates an example of using a focus detection pixel which includes a light shielding member. Parts having the same functions as those in FIGS. 3A to 3C are denoted by the same reference numerals, and their detailed description will be omitted. FIG. 11D illustrates an example of using a focus detection pixel which includes a plurality of photoelectric conversion units. Parts having the same functions as those in FIGS. 4A to 4C are denoted by the same reference numerals, and their detailed description will be omitted.

The image pickup pixel illustrated in FIG. 11B uses a symmetrical microlens. The center of the microlens 1108 in plan view is displaced toward the center of the pixel region 1101. The focus detection pixels illustrated in FIGS. 11C and 11D each use an asymmetrical microlens. The levels of microlens power at portions indicated by double-headed arrows in FIGS. 11C and 11D are higher than that in FIG. 11B. With the structures illustrated in FIGS. 11C and 11D, it is possible to maintain the sensitivity and improve the focus detection accuracy even in an outer part of the pixel region 1101.

Figure 12A:
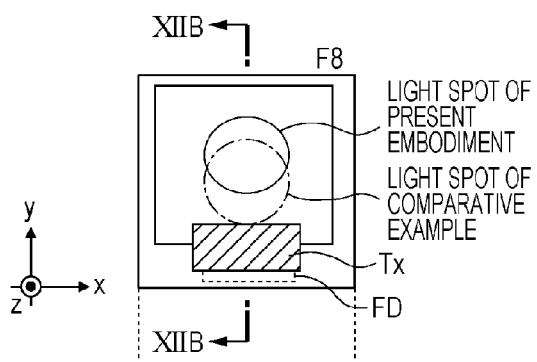
FIGS. 12A and 12C are each a top view of a pixel provided with an asymmetrical microlens.
Figure 12C:
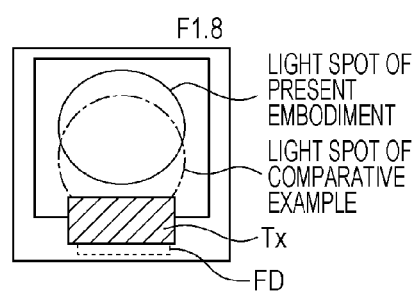
Figure 12B:
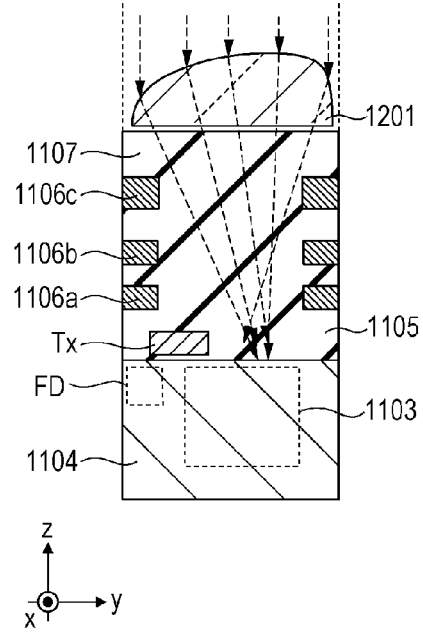
FIG. 12B is a cross-sectional view of FIG. 12A.

With reference to FIGS. 12A to 12C, a description is given of an example where an asymmetrical microlens of the present invention is used for an image pickup pixel. FIGS. 12A and 12C are top views for explaining spot shapes corresponding to different F-numbers of objective lenses. FIG. 12B is a cross-sectional view taken along line XIIB-XIIB of FIG. 12A. In FIG. 12B, parts having the same functions as those in FIG. 11B are denoted by the same reference numerals, and their detailed description will be omitted. In FIGS. 12A and 12C, each spot indicated by a solid line is formed when an asymmetrical microlens 1201 is used for an image pickup pixel, and each spot indicated by a dotted line is formed when a symmetrical microlens is used for an image pickup pixel. The image pickup device is designed such that before light passing through the microlens reaches the photoelectric conversion unit, a conductive pattern made of metal or polysilicon is not irradiated with the light. However, in the case of a smaller pixel, a conductive pattern made of polysilicon may be irradiated with light due to optical characteristics and constraints of conductive pattern layout. For example, as in the case of the spots indicated by solid lines in FIGS. 12A and 12C, the conductive pattern may be either irradiated or not, depending on the F-number of the lens. In this case, using an asymmetrical microlens can reduce light irradiation of the conductive pattern. For example, this makes it possible to reduce the phenomenon of changing optical characteristics depending on the F-number. This phenomenon may also be reduced, to some extent, by planar displacement of a focus using a symmetrical microlens. However, it is practically difficult to vary the amount of displacement for each pixel. Therefore, it is desirable to use an asymmetrical microlens to change the focus position in plan view. This is particularly effective when the photoelectric conversion unit and the conductive pattern made of polysilicon are disposed in mirror arrangement.

As described above, the idea of the present invention involves using an asymmetrical microlens for any of pixels in the image-plane AF image pickup device so as to improve both sensitivity and focus detection accuracy. Structures of the present invention will be described in further detail using the following specific embodiments. It is to be understood that the present invention is not to be interpreted as limited to these embodiments. Various changes and combinations can be made within the scope of the idea of the invention.

In the following specific embodiments, a pixel referred to as "image pickup pixel" does not necessarily need to be used only for image pickup, and may also have the function of focus detection or light power detection. For example, the focus detection involves detecting sharpness of a picture from a video signal obtained by the image pickup device. Then, a signal for a so-called TV-AF method may be output to control the search for a focus lens position at which the detected sharpness, which is an AF evaluation value, is highest.

Embodiment 1

An image pickup device of the present embodiment will be described with reference to FIGS. 13A and 13B and FIGS. 14A and 14B. The image pickup device of the present embodiment is the same as the image pickup device described with reference to FIGS. 3A to 3C and FIG. 5. Parts having the same functions as those in FIGS. 3A to 3C are denoted by the same reference numerals, and their detailed description will be omitted.

Figure 13A:
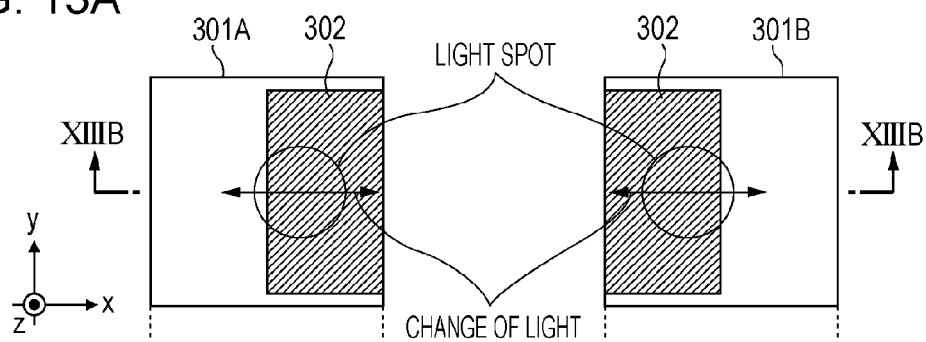
FIGS. 13A and 13B are a top view and a cross-sectional view, respectively, of pixels in an image pickup device of embodiment 1.
Figure 13B:
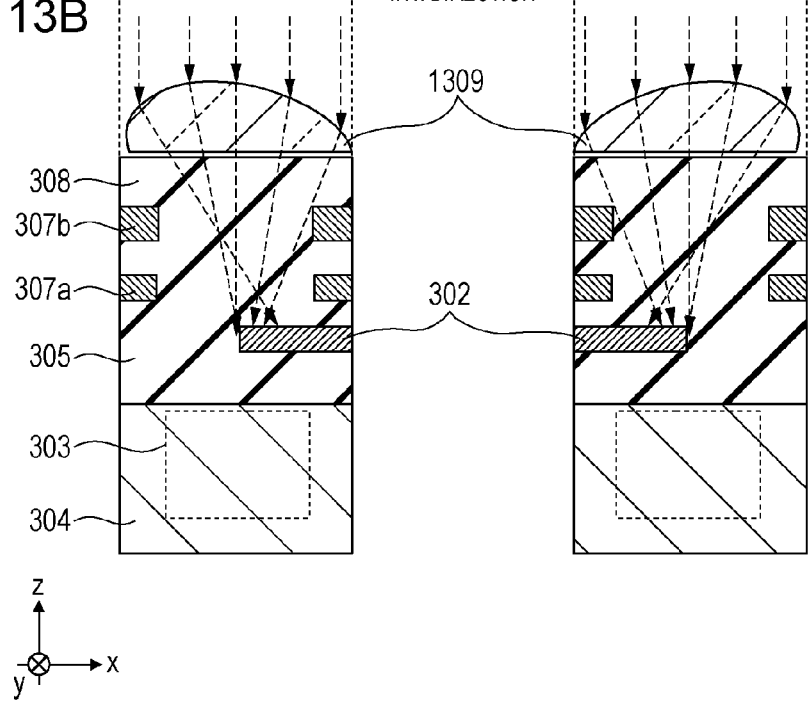

FIG. 13A is a top view of focus detection pixels of the image pickup device of the present embodiment. In FIG. 13A, each area hatched with diagonal lines indicates the light shielding member 302. Each circle in FIG. 13A represents a spot formed near the light shielding member 302 by an asymmetrical microlens 1309. On the right-hand side of FIG. 13A, the left half of the photoelectric conversion unit is shielded from light by the light shielding member 302, and on the left-hand side of FIG. 13A, the right half of the photoelectric conversion unit is shielded from light by the light shielding member 302. By using signals from these two focus detection pixels, focus detection based on a phase difference can be performed. FIG. 13B is a cross-sectional view taken along line XIIIB-XIIIB of FIG. 13A.

In the present embodiment, the vertex position of the asymmetrical microlens 1309 does not overlap the light shielding member 302 in plan view. With this structure, the microlens height is lowered on the side of the light shielding member 302, and the lens power on the light shielding member 302 is weakened. This increases the amount of light incident on the light shielding member 302, enhances A-B image separation, and thus improves focus detection accuracy.

FIGS. 14A and 14B illustrate other pixels of embodiment 1. FIG. 14A is a top view of focus detection pixels in the image pickup device of the present embodiment, and FIG. 14B is a cross-sectional view taken along line XIVB-XIVB of FIG. 14A. Again, parts having the same functions as those in FIGS. 3A to 3C are denoted by the same reference numerals, and their detailed description will be omitted. A difference from FIGS. 13A and 13B is the vertex position of the asymmetrical microlens. In this embodiment, the vertex position of an asymmetrical microlens 1409 overlaps the light shielding member 302 in plan view. The microlens height is higher on the side of the light shielding member 302. With this structure, the microlens power is higher in an area overlapping the light shielding member 302 in plan view. This increases the amount of light blocked by the light shielding member 302, allows accurate A-B image separation, and thus improves focus detection accuracy.

Comparative Example

FIG. 15A is a top view of focus detection pixels in an image pickup device of a comparative example, and FIG.

15B is a cross-sectional view taken along line XVB-XVB of FIG. 15A. A difference from the embodiments illustrated in FIGS. 13A and 13B and FIGS. 14A and 14B is that the microlens of this comparative example is a symmetrical microlens 1509. FIG. 16 shows optical characteristics of the image pickup device of embodiment 1 in FIGS. 13A and 13B and FIGS. 14A and 14B and the image pickup device of the comparative example in FIGS. 15A and 15B. Solid lines represent optical characteristics of the image pickup device in FIGS. 13A and 13B and FIGS. 14A and 14B, and dotted lines represent optical characteristics of the image pickup device of the comparative example in FIGS. 15A and 15B. FIG. 16 shows that the dotted curves representing distributions of pupil intensity are gentler. This means that A-B image separation is not good enough in the comparative example, and that the focus detection accuracy is higher in the structures illustrated in FIGS. 13A and 13B and FIGS. 14A and 14B.

Thus, in embodiment 1 which uses an asymmetrical microlens for a focus detection pixel, the planar position of the focus can be changed and higher focus detection accuracy can be achieved, as compared to using a symmetrical microlens of the related art.

Embodiment 2

Figure 17A:
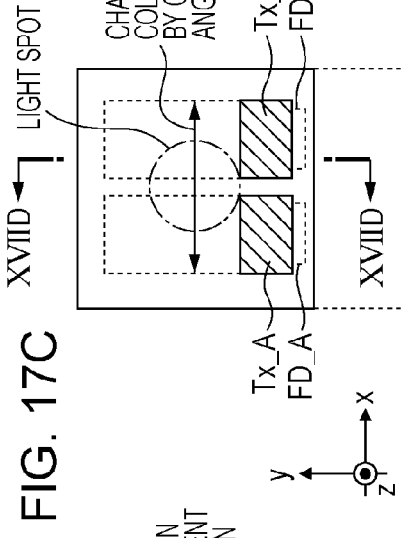
FIGS. 17A and 17B are a top view and a cross-sectional view, respectively, of a pixel in an image pickup device of embodiment 2.
Figure 17B:
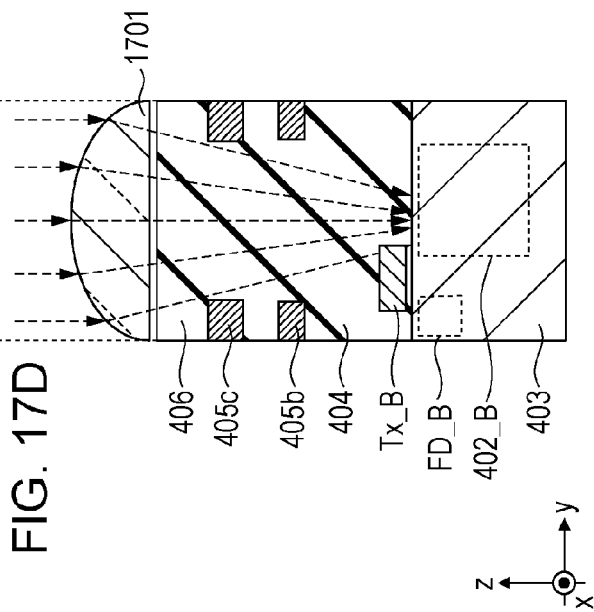
Figure 17C:
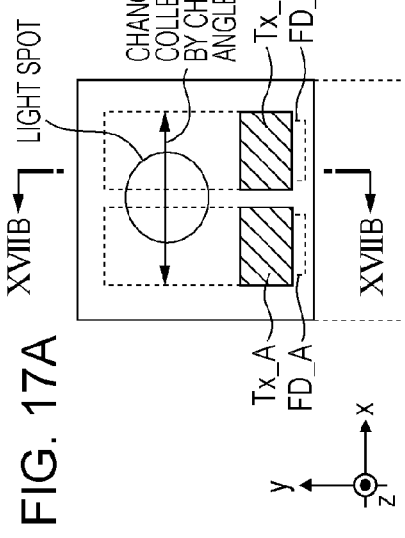
FIGS. 17C and 17D are a top view and a cross-sectional view, respectively, of a pixel in an image pickup device of a comparative example.
Figure 17D:
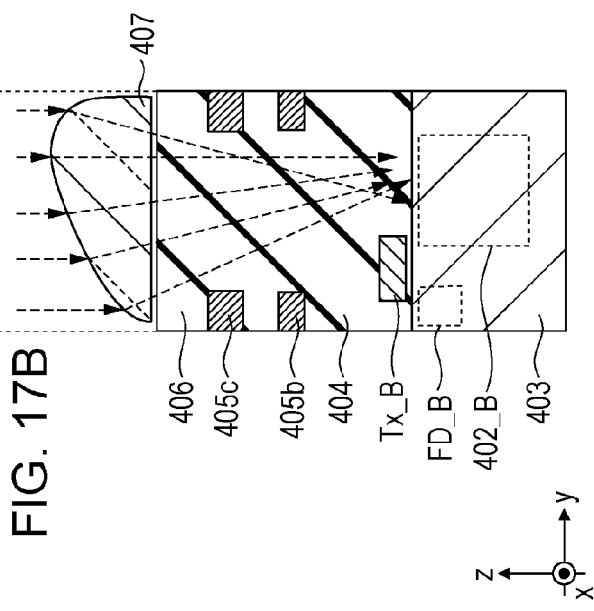

An image pickup device of the present embodiment will be described with reference to FIGS. 17A to 17D. The image pickup device of the present embodiment is the same as the image pickup device described with reference to FIGS. 4A to 4C and FIG. 6. Parts having the same functions as those in FIGS. 4A to 4C are denoted by the same reference numerals, and their detailed description will be omitted. FIG. 17A is a top view of a pixel in the image pickup device of the present embodiment, and FIG. 17B is a cross-sectional view taken along line XVIIB-XVIIB of FIG. 17A. FIG. 17C is a top view of a pixel in an image pickup device of a comparative example, and FIG. 17D is a cross-sectional view taken along line XVIID-XVIID of FIG. 17C. The image pickup device of this comparative example differs from that of embodiment 2 in that it includes a symmetrical microlens 1701.

The cross section shown in FIG. 17B differs from that in FIG. 4C. FIG. 4C shows a cross section orthogonal to a channel extending from the photoelectric conversion unit to the floating diffusion FD. On the other hand, the present embodiment shows a cross section parallel to this channel.

The image pickup device of the present embodiment includes the transfer gate electrodes Tx_A and Tx_B that transfer charges from the photoelectric conversion units to the floating diffusions FD. The transfer gate electrodes Tx_A and Tx_B are made of polysilicon. Since light incident on the polysilicon cannot be used as a signal, the amount of light is reduced at specific incident angles.

Figure 18:
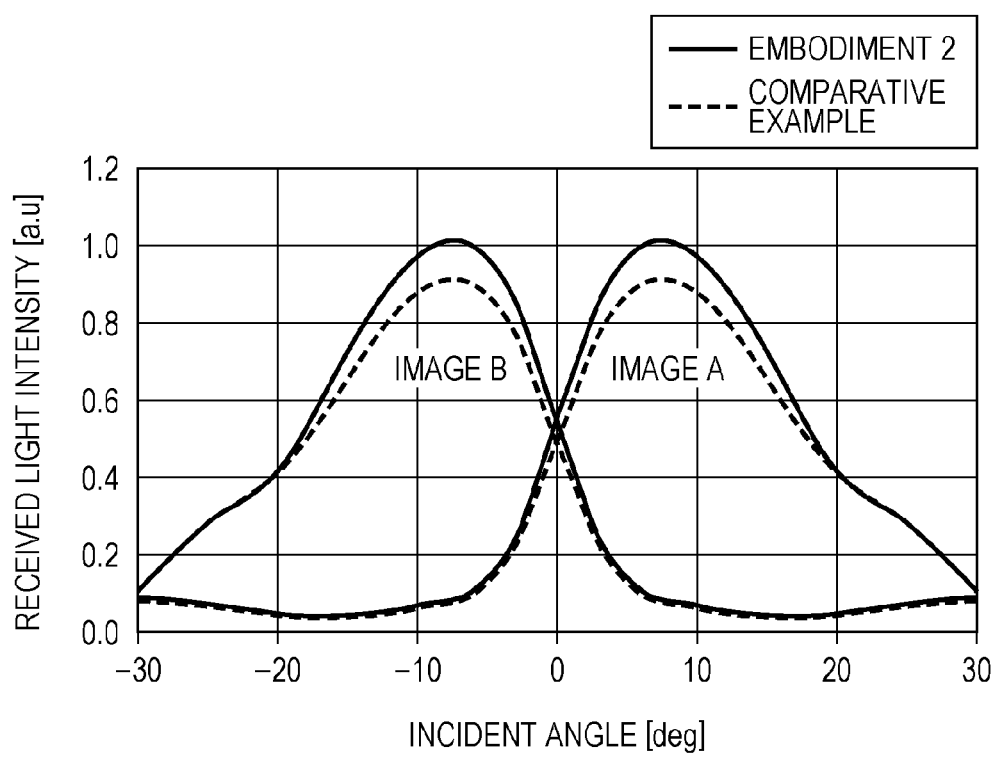
FIG. 18 shows optical characteristics of embodiment 2 and the comparative example.

FIG. 18 compares optical characteristics of the image pickup device of the present embodiment illustrated in FIGS. 17A and 17B and the image pickup device of the comparative example illustrated in FIGS. 17C and 17D. FIG. 18 shows that, in the comparative example, the sensitivity is lowered at an incident angle ranging from 0° to 15° and the curves representing distributions of pupil intensity are gentler. Thus, the sensitivity and the focus detection accuracy are higher in the present embodiment than in the comparative example.

Embodiment 3

An image pickup device of the present embodiment will be described with reference to FIGS. 19A to 19C and FIGS. 20A to 20D. As a pixel for focus detection, the image pickup device of the present embodiment uses a focus detection pixel which includes a light shielding member. FIGS. 19B and 19C illustrate cross-sectional structures of a pair of pupil-divided pixels disposed at a predetermined position in the imaging plane. FIGS. 20A to 20D illustrate differences in cross-sectional structure among focus detection pixels at different positions in the imaging plane.

Figure 19A:
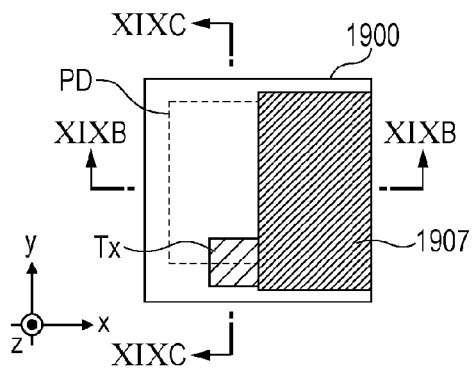
FIG. 19A is a top view of a pixel in an image pickup device of embodiment 3.
Figure 19B:
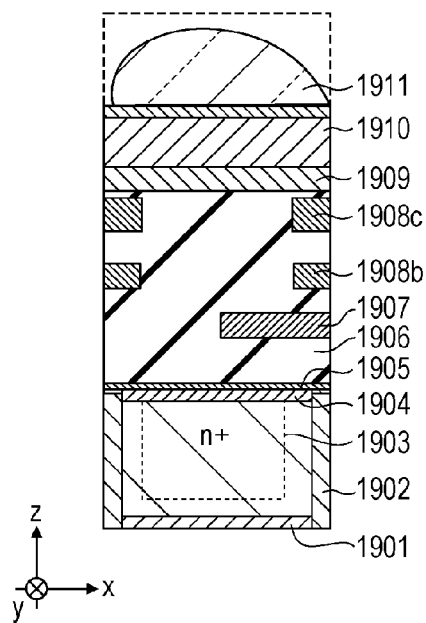
FIGS. 19B and 19C are cross-sectional views of FIG. 19A.
Figure 19C:
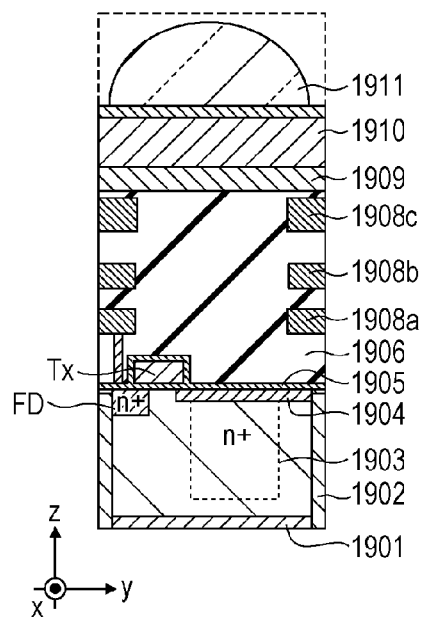

FIG. 19A is a top view of a focus detection pixel, and shows outer edges of a light shielding member 1907 and a photoelectric conversion unit PD in plan view. The outer edge of a pixel 1900 represents boundaries with adjacent pixels. For example, this outer edge is defined by a boundary between an active region and an element isolation region. FIGS. 19B and 19C are cross-sectional views taken along line XIXB-XIXB and line XIXC-XIXC, respectively, of FIG. 19A. A point of intersection of lines XIXB-XIXB and XIXC-XIXC is a position corresponding to the vertex of an asymmetrical microlens 1911. The vertex position is off the center of the photoelectric conversion unit PD in plan view.

In FIGS. 19B and 19C, an N-type semiconductor region 1903 and a P-type semiconductor region 1904 on the surface of the N-type semiconductor region 1903 form an embedded photodiode which serves as a photoelectric conversion unit. The N-type semiconductor region 1903 is surrounded by a lightly doped semiconductor region. For example, the N-type semiconductor region 1903 is surrounded by an N-type epitaxial layer. A P-type semiconductor region 1902 is a heavily doped semiconductor region disposed around the N-type semiconductor region 1903. The P-type semiconductor region 1902 is provided to reduce mixing-in of charges from adjacent pixels. A P-type semiconductor region 1901 is a layer disposed at a predetermined depth. The P-type semiconductor region 1901 is provided to collect signal charges at a deep portion of the substrate into the N-type semiconductor region 1903. Alternatively, when an N-type semiconductor substrate is provided under the P-type semiconductor region 1901, the P-type semiconductor region 1901 may serve to reduce mixing-in of noise charges from this N-type semiconductor substrate. A P-type semiconductor region may be provided between the N-type semiconductor region 1903 and the floating diffusion FD to increase the height of a potential barrier between the N-type semiconductor region 1903 and the floating diffusion FD.

An antireflective film 1905 is disposed on the upper side of the photoelectric conversion unit PD. The antireflective film 1905 includes a silicon nitride film. The light shielding member 1907 is disposed on the antireflective film 1905, with an interlayer insulating film 1906 interposed therebetween. Referring to FIG. 19A, the light shielding member 1907 is positioned to shield the right-hand side of the photoelectric conversion unit PD from light in plan view. The light shielding member 1907 is formed by a wiring layer 1908a which is the first wiring layer. A wiring layer 1908b (second wiring layer) is disposed on the upper side of the wiring layer 1908a (first wiring layer), with the interlayer insulating film 1906 interposed therebetween, and a wiring layer 1908c (third wiring layer) is disposed on the upper side of the wiring layer 1908b (second wiring layer), with the interlayer insulating film 1906 interposed therebetween. The interlayer insulating film 1906 on the upper side of the wiring layer 1908c (third wiring layer), which is the uppermost wiring layer, is planarized and provided with a protective film 1909 on its upper side. A silicon oxide film may be used as the interlayer insulating film 1906, and a silicon nitride film may be used as the protective film 1909. A color filter 1910 is disposed on the protective film 1909, and the asymmetrical microlens 1911 is disposed on the color filter 1910. A planarizing film may be provided between the color filter 1910 and the asymmetrical microlens 1911 as needed.

As can be seen in FIGS. 19A and 19B, the vertex position of the asymmetrical microlens 1911 is off the light shielding member 1907 and is located in an aperture area in plan view. Since the position of the vertex in plan view does not overlap the light shielding member 1907 and is located in the aperture area, light incident on the upper side of the light shielding member 1907 can be efficiently converged to the center of the photoelectric conversion unit PD. This can improve the focus detection accuracy.

With reference to FIGS. 20A to 20D, differences in cross-sectional structure among focus detection pixels at different positions in the imaging plane will be described. FIG. 20A is a top view of the image pickup device, where point b is at substantially the center of the pixel region and points c and d are arranged in a predetermined direction away from point b. In other words, points c and d are arranged outside point b within the pixel region. FIGS. 20B to 20D each provide a top view of a pixel and a cross-sectional view taken along line L-M of the top view. Specifically, FIG. 20B illustrates a cross-sectional structure of a focus detection pixel at point b in FIG. 20A, FIG. 20C illustrates a cross-sectional structure of a focus detection pixel at point c in FIG. 20A, and FIG. 20D illustrates a cross-sectional structure of a focus detection pixel at point d in FIG. 20A. Parts having the same functions as those in FIGS. 19A to 19C are denoted by the same reference numerals, and their detailed description will be omitted. As for the same components throughout FIGS. 20B to 20D, only those in FIG. 20B are denoted by the reference numerals and their repetitive description will be omitted.

The differences among FIGS. 20B to 20D are the vertex positions (indicated by x-marks) of asymmetrical microlenses 2001 to 2003. The vertex position in FIG. 20C is more distant from the corresponding light shielding member 1907 than the vertex position in FIG. 20B. That is, the vertex position in FIG. 20C is displaced more to the center of the pixel region than the vertex position in FIG. 20B. The vertex position in FIG. 20D is more distant from the corresponding light shielding member 1907 than the vertex positions in FIGS. 20B and 20C. That is, the vertex position in FIG. 20D is displaced more to the center of the pixel region than the vertex positions in FIGS. 20B and 20C. Although the vertex position of the asymmetrical microlens 2001 in FIG. 20B is located in the aperture area of the light shielding member 1907 in plan view, the vertex position of the asymmetrical microlens 2003 in FIG. 20D is displaced to a position overlapping the wiring layer 1908b or 1908c of the adjacent pixel in plan view. The vertex position of the asymmetrical microlens 2002 in FIG. 20C may be located in the aperture area of the light shielding member 1907 in plan view, or may be displaced to a position overlapping the wiring layer 1908b or 1908c in plan view.

As described above, by varying the vertex position of the asymmetrical microlens depending on the location in the pixel region, it is possible not only to achieve the effects obtained in the above-described embodiments, but also to improve the oblique incidence characteristic.

Embodiment 4

An image pickup device of the present embodiment will be described with reference to FIGS. 21A to 21C and FIGS. 22A to 22D. A difference from embodiment 3 is that a focus detection pixel of the present embodiment includes a plurality of photoelectric conversion units. FIGS. 21B and 21C are cross-sectional views of a focus detection pixel located at a predetermined position in the imaging plane. FIGS. 22A to 22D illustrate differences in cross-sectional structure among focus detection pixels at different positions in the imaging plane.

FIG. 21A is a top view of the focus detection pixel, which includes photoelectric conversion units PD1 and PD2, transfer gate electrodes TX1 and TX2, and floating diffusions FD1 and FD2. The outer edges of the photoelectric conversion units PD1 and PD2 and the transfer gate electrodes TX1 and TX2 are each defined by a boundary with an element isolation region. The outer edge of the region between the photoelectric conversion units PD1 and PD2 is defined by a PN junction surface joined to a P-type semiconductor region 2111. A point of intersection of lines XXIB-XXIB and XXIC-XXIC is a position corresponding to the vertex of an asymmetrical microlens 2110. The vertex position is away (displaced) from the transfer gate electrodes TX1 and TX2 in plan view. With this structure, it is possible to reduce the amount of light absorbed by the transfer gate electrodes TX1 and TX2 and improve sensitivity. The outer edge of a pixel 2100 represents boundaries with adjacent pixels. For example, this outer edge is defined by a boundary between an active region and an element isolation region. FIG. 21B is a cross-sectional view taken along line XXIB-XXIB of FIG. 21A, and FIG. 21C is a cross-sectional view taken along line XXIC-XXIC of FIG. 21A.

Referring to FIGS. 21B and 21C, two embedded photodiodes serving as the photoelectric conversion units PD1 and PD2 include N-type semiconductor regions 2103A and 2103B, respectively, which are provided with a P-type semiconductor region 2104 on their surfaces. The N-type semiconductor regions 2103A and 2103B are surrounded by the P-type semiconductor region 2111, and charges in the N-type semiconductor region 2103A can be read out independently of charges in the N-type semiconductor region 2103B.

A P-type semiconductor region 2102 is a heavily doped semiconductor region disposed around the N-type semiconductor regions 2103A and 2103B. The P-type semiconductor region 2102 is provided to reduce mixing-in of charges from adjacent pixels. A P-type semiconductor region 2101 is a layer disposed at a predetermined depth. The P-type semiconductor region 2101 is provided to collect signal charges at a deep portion of the substrate into the N-type semiconductor regions 2103A and 2103B. Alternatively, when an N-type semiconductor substrate is provided under the P-type semiconductor region 2101, the P-type semiconductor region 2101 may serve to reduce mixing-in of noise charges from this N-type semiconductor substrate.

An antireflective film 2105 is disposed on the upper side of the photoelectric conversion units PD1 and PD2. The antireflective film 2105 includes a silicon nitride film. Wiring layers 2107a to 2107c, which are the first to third layers, are electrically insulated from each other by an interlayer insulating film 2106. The interlayer insulating film 2106 on the upper side of the wiring layer 2107c (third layer), which is the uppermost wiring layer, is planarized and provided with a protective film 2108 on its upper side. A silicon oxide film may be used as the interlayer insulating film 2106, and a silicon nitride film may be used as the protective film 2108. A color filter 2109 is disposed on the protective film 2108, and the asymmetrical microlens 2110 is disposed on the color filter 2109. A planarizing film may be provided between the color filter 2109 and the asymmetrical microlens 2110 as needed.

With reference to FIGS. 22A to 22D, differences in cross-sectional structure among focus detection pixels at different positions in the imaging plane will be described. FIG. 22A is a top view of the image pickup device, where point b is at substantially the center of the pixel region and points c and d are arranged in a predetermined direction away from point b. In other words, points c and d are arranged outside point b within the pixel region. FIGS. 22B to 22D each provide a top view of a pixel and a cross-sectional view taken along line u3-u4 of the top view. Specifically, FIG. 22B illustrates a cross-sectional structure of a focus detection pixel at point b in FIG. 22A, FIG. 22C illustrates a cross-sectional structure of a focus detection pixel at point c in FIG. 22A, and FIG. 22D illustrates a cross-sectional structure of a focus detection pixel at point d in FIG. 22A. Parts having the same functions as those in FIGS. 21A to 21C are denoted by the same reference numerals, and their detailed description will be omitted. As for the same components throughout FIGS. 22B to 22D, only those in FIG. 22B are denoted by the reference numerals and their repetitive description will be omitted.

The differences among FIGS. 22B to 22D are the vertex positions (indicated by x-marks) of asymmetrical microlenses 2201 to 2203. The vertex position in FIG. 22C is displaced more to the center of the pixel region than the vertex position in FIG. 22B. The vertex position in FIG. 22D is displaced more to the center of the pixel region than the vertex positions in FIGS. 22B and 22C. Although the vertex position of the asymmetrical microlens 2201 in FIG. 22B is located in the aperture area of the wiring layers 2107a to 2107c in plan view, the vertex position of the asymmetrical microlens 2203 in FIG. 22D is displaced to a position overlapping the wiring layer 2107b or 2107c of the adjacent pixel in plan view. The vertex position of the asymmetrical microlens 2202 in FIG. 22C may be located in the aperture area in plan view, or may be displaced to a position overlapping the wiring layers 2107a to 2107c in plan view.

As described above, by varying the vertex position of the asymmetrical microlens depending on the location in the pixel region, it is possible not only to achieve the effects obtained in the above-described embodiments, but also to improve the oblique incidence characteristic.

Embodiment 5

An image pickup device of the present embodiment will be described with reference to FIGS. 23A to 23C. The concept of the present embodiment is applicable to any of the embodiments described above. As illustrated, both symmetrical and asymmetrical microlenses are arranged in the present embodiment. For example, the asymmetrical microlenses are used for focus detection pixels.

FIG. 23A is a top view of the entire pixel region. FIG. 23B is a top view of 15 pixels at position b in FIG. 23A, and FIG. 23C is a top view of 15 pixels at position c in FIG. 23A. In FIGS. 23B and 23C, an x-mark indicates the vertex position of each microlens. Also in FIGS. 23B and 23C, a solid line indicates the outer edge of the pixel area of each pixel disposed on a semiconductor substrate, such as a photoelectric conversion unit, and a dotted line indicates the outer edge of each microlens corresponding to one pixel. The outer edge of the microlens is defined by a square having its center at the center of each symmetrical microlens and having a microlens pitch as the length of its side.

In FIG. 23B, the vertex position of each microlens does not coincide with the center of the corresponding pixel area. In any of the pixels, the vertex position of each microlens is displaced toward the center of the entire pixel region. The amount of displacement of the vertex position of each asymmetrical microlens is larger than the amount of displacement of the vertex position of each symmetrical microlens.

In FIG. 23C, the vertex position of each microlens does not coincide with the center of the corresponding pixel area. In any of the pixels, the vertex position of each microlens is displaced toward the center of the entire pixel region. In FIG. 23B, the vertex position of each microlens is displaced in a horizontal direction (leftward in the drawing). In FIG. 23C, the vertex position of each microlens is displaced in an oblique direction (in the upper-left direction in the drawing). The amount of displacement of the vertex position of each asymmetrical microlens is larger than the amount of displacement of the vertex position of each symmetrical microlens.

As described above, by varying the vertex position of the asymmetrical microlens depending on the location in the pixel region, it is possible not only to achieve the effects obtained in the above-described embodiments, but also to improve the oblique incidence characteristic.

Embodiment 6

Figure 24A:
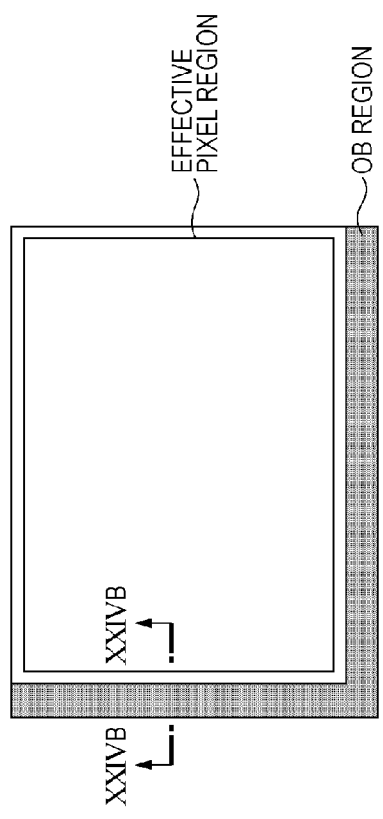
FIG. 24A is a top view of a pixel region in an image pickup device of embodiment 6.
Figure 24B:
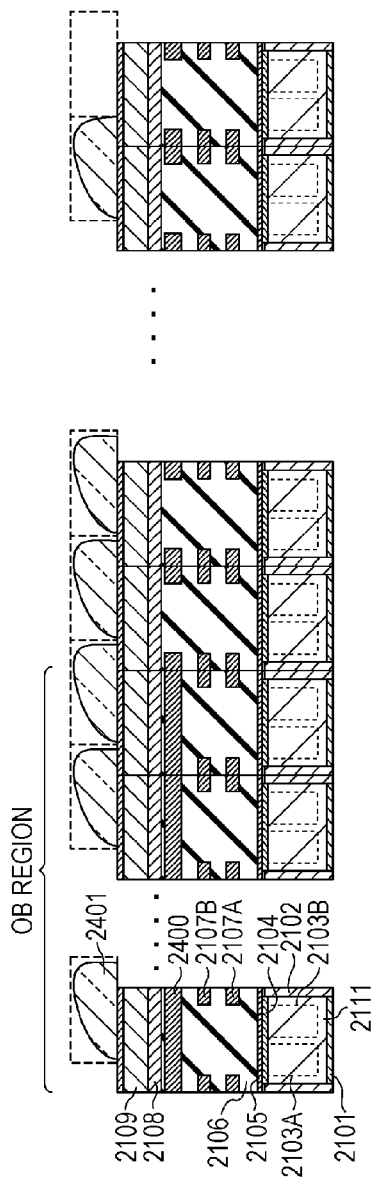
FIG. 24B is a cross-sectional view of FIG. 24A.

An image pickup device of the present embodiment will be described with reference to FIGS. 24A and 24B. The concept of the present embodiment is applicable to any of the embodiments described above. A pixel region in the image pickup device of the present embodiment includes an effective pixel region and an optical black region (OB region) surrounding the effective pixel region. FIG. 24A is a top view of the image pickup device of the present embodiment, and FIG. 24B is a cross-sectional view taken along line XXIVB-XXIVB of FIG. 24A. Parts having the same functions as those in FIG. 22B are denoted by the same reference numerals, and their detailed description will be omitted.

In the present embodiment, the photoelectric conversion units of each pixel in the OB region are entirely shielded from light by a light shielding member 2400. Asymmetrical microlenses 2401 are arranged in both the effective pixel region and the OB region. With this structure, the level of discontinuity at the boundary between the effective pixel region and the OB region can be reduced.

The vertex position of each asymmetrical microlens may be displaced toward the center of the pixel region in both the effective pixel region and the OB region. Although a focus detection pixel including a plurality of photoelectric conversion units is used here, the structure of the present embodiment is also applicable to a focus detection pixel including a light shielding member.

In the present embodiment, it is possible not only to achieve the effects obtained in the above-described embodiments, but also to reduce the level of discontinuity at the boundary between the effective pixel region and the OB region.

Embodiment 7

An image pickup device of the present embodiment will be described with reference to FIGS. 25A and 25B and FIGS. 26A to 26C. The image pickup devices of a front-side illumination type have been described in the embodiments above. The image pickup device of the present embodiment differs from those described above in that it is of a back-side illumination type. The back-side illumination type refers to a structure in which an asymmetrical microlens is disposed on a principal surface (second surface) opposite the other principal surface (first surface) where a gate electrode of each transistor and wiring are provided, so that light is incident from the opposite principal surface (second surface).

Figure 25A:
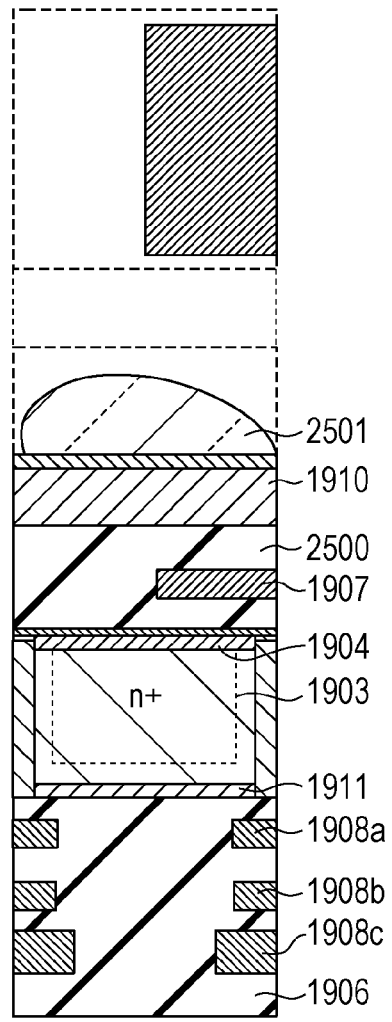
FIGS. 25A and 25B each provide a top view and a cross-sectional view of a pixel in an image pickup device of embodiment 7.
Figure 25B:
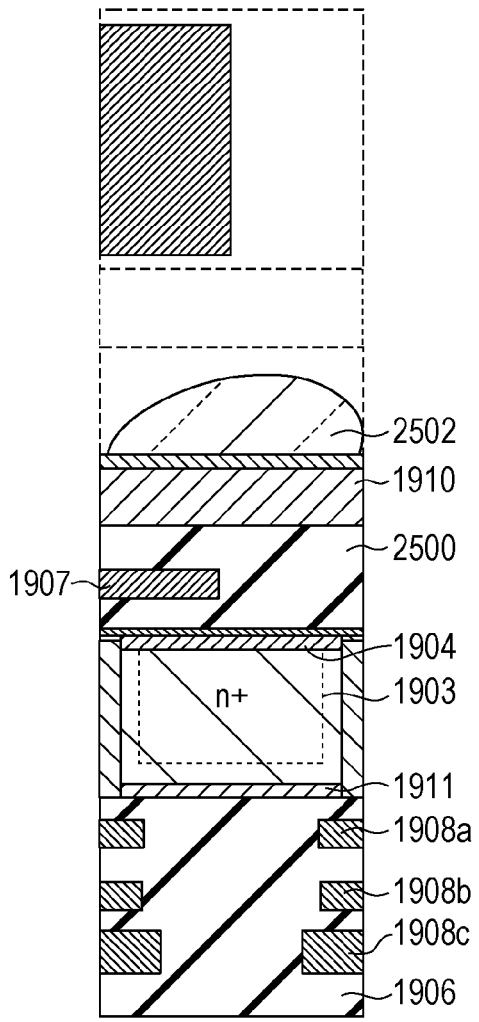
Figure 26A:
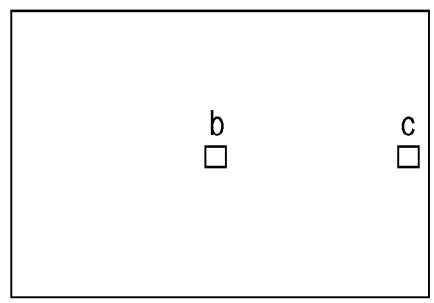
FIG. 26A is a top view of the image pickup device of embodiment 7.
Figure 26B:
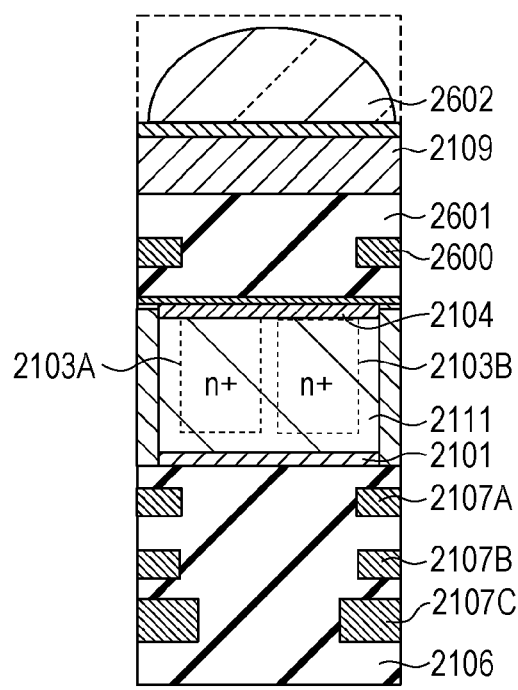
FIGS. 26B and 26C are each a cross-sectional view of a pixel in FIG. 26A.
Figure 26C:
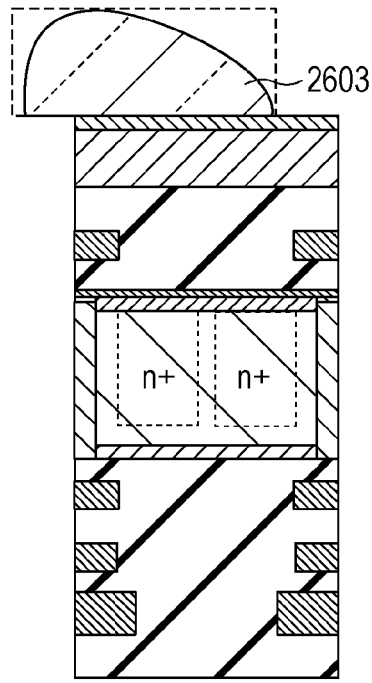

FIGS. 25A and 25B illustrate focus detection pixels each including a light shielding member, and FIGS. 26A to 26C illustrate examples of focus detection pixels each including a plurality of photoelectric conversion units. In FIGS. 25A and 25B, parts having the same functions as those in FIGS. 19A to 19C are denoted by the same reference numerals, and their detailed description will be omitted. Also in FIGS. 26A to 26C, parts having the same functions as those in FIGS. 21A to 21C are denoted by the same reference numerals, and their detailed description will be omitted.

FIGS. 25A and 25B illustrate cross-sectional structures of a pair of pupil-divided focus detection pixels disposed at a predetermined position in the imaging plane. The light shielding member 1907 is disposed on the back side (light incidence side) and surrounded by an insulating material 2500. The vertex positions of asymmetrical microlenses 2501 and 2502 are each located in an area (i.e., aperture area) where the light shielding member 1907 is not present in plan view.

FIG. 26A is a top view of the image pickup device, FIG. 26B illustrates a cross-sectional structure of a focus detection pixel at position b of FIG. 26A, and FIG. 26C illustrates a cross-sectional structure of a focus detection pixel at position c of FIG. 26A. Position b is closer to the center of the pixel region than position c.

A light shielding member 2600 surrounded by an insulating material 2601 is disposed on the back side (light incidence side). In the image pickup device of a back-side illumination type, the amounts of displacement of the vertex positions of asymmetrical microlenses 2602 and 2603 at different locations in the pixel region are different.

In the present embodiment, where asymmetrical microlenses are used for an image-plane AF image pickup device of a back-side illumination type, it is possible not only to achieve the effects obtained in the above-described embodiments, but also to improve sensitivity. Additionally, since the degree of freedom in changing the focus position is increased, mixing of colors can be reduced.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2014-114432, filed Jun. 2, 2014.

What is claimed is:

1. An image pickup device comprising:
   a pixel region having a plurality of pixels that are two-dimensionally arranged, the plurality of pixels including a plurality of image pickup pixels and a plurality of focus detection pixels, the focus detection pixels each being configured to output a signal for focus detection based on phase difference detection;
   a plurality of microlenses arranged to correspond to respective photoelectric conversion units of the respective image pickup pixels; and
   a plurality of microlenses arranged to correspond to respective photoelectric conversion units of the respective focus detection pixels,
   wherein, when at least one of the plurality of microlenses is orthogonally projected onto a corresponding photoelectric conversion unit, a vertex position of the at least one microlens that is orthogonally projected is off a center position of the at least one microlens.

2. The image pickup device according to claim 1, wherein the plurality of focus detection pixels include a group of pairs of pupil-divided focus detection pixels.

3. The image pickup device according to claim 2, wherein each pixel in the group of pairs of pupil-divided focus detection pixels receives light that passes through part of an exit pupil of an imaging optical system.

4. The image pickup device according to claim 3, wherein a plurality of pixels included in the group of pairs of pupil-divided focus detection pixels each include a light shielding member that shields part of the corresponding photoelectric conversion unit from light.

5. The image pickup device according to claim 1, wherein the plurality of focus detection pixels each include a plurality of photoelectric conversion units, and a signal of each of the photoelectric conversion units can be independently read out.

6. The image pickup device according to claim 1, wherein when at least one of the plurality of microlenses that are arranged to correspond to the respective photoelectric conversion units of the respective focus detection pixels is orthogonally projected onto a corresponding photoelectric conversion unit, a vertex position of the at least one microlens that is orthogonally projected is off a center position of the at least one microlens.

7. The image pickup device according to claim 1, wherein when at least one of the plurality of microlenses that are arranged to correspond to the respective photoelectric conversion units of the respective image pickup pixels is orthogonally projected onto a corresponding photoelectric conversion unit, a vertex position of the at least one microlens that is orthogonally projected is off a center position of the at least one microlens.

8. The image pickup device according to claim 1, wherein the plurality of pixels include a first pixel disposed at a first position and a second pixel disposed outside the first position in the pixel region;
   a vertex position of a first microlens disposed to correspond to a photoelectric conversion unit of the first pixel is off a center position of the photoelectric conversion unit of the first pixel towards a center of the pixel region, and a vertex position of a second microlens disposed to correspond to a photoelectric conversion unit of the second pixel is off a center position of the photoelectric conversion unit of the second pixel towards the center of the pixel region; and
   a distance by which the vertex position of the second microlens is off the center position of the photoelectric conversion unit of the second pixel towards the center of the pixel region is larger than a distance by which the vertex position of the first microlens is off the center position of the photoelectric conversion unit of the first pixel towards the center of the pixel region.

9. The image pickup device according to claim 8, wherein the first pixel and the second pixel are focus detection pixels.

10. The image pickup device according to claim 8, wherein the first pixel and the second pixel are image pickup pixels.

11. The image pickup device according to claim 1, wherein a contour of the at least one microlens whose vertex position is off the center position thereof when orthogonally projected onto the corresponding photoelectric conversion unit is formed by a curved shape radially narrowed in plan view and a curved shape radially lowered in cross-sectional view.

12. The image pickup device according to claim 1, wherein the plurality of microlenses are arranged in a first direction and include a third microlens distant by a first distance in the first direction from a center of the pixel region;
the third microlens including a bottom part that extends in a plane containing the first direction and a second direction orthogonal to the first direction;
the bottom part, in plan view, having a first width along the second direction at a first position, the first position being within the third microlens and along the first direction, and also having a second width along the second direction at a second position, the second position being within the third microlens and more distant from the center of the pixel region than the first position, and the second width being narrower than the first width; and
the at least one microlens whose vertex position is off the center position thereof when orthogonally projected onto the corresponding photoelectric conversion unit has, when a first cross section thereof along the second direction is taken at the first position, a first curvature radius and a first height highest in the first cross section, and also has, when a second cross section thereof along the second direction is taken at the second position, a second curvature radius larger than the first curvature radius and a second height highest in the second cross section lower than the first height.

13. The image pickup device according to claim 1, wherein the pixel region includes an effective pixel region and an optical black region, and microlenses are arranged in both the effective pixel region and the optical black region, the microlenses each having a vertex position off a center position thereof when orthogonally projected onto the corresponding photoelectric conversion unit.

14. The image pickup device according to claim 1, wherein the plurality of pixels include an amplification transistor that amplifies a signal generated by each photoelectric conversion unit, and light is incident from a principal surface opposite the other principal surface where a gate electrode of the amplification transistor is disposed.

15. An image pickup system comprising:
the image pickup device according to claim 1; and
an image pickup lens configured to collect light onto the image pickup device,
wherein the image pickup lens is controlled in accordance with a phase difference detection signal output from the image pickup device.

16. An image pickup device comprising:
a pixel region having a plurality of pixels that are two-dimensionally arranged from a center to a periphery of a two-dimensional array,
wherein a first pixel comprises:
a first photoelectric conversion unit provided in a semiconductor substrate;
a second photoelectric conversion unit provided in a semiconductor substrate; and
a first microlens provided as a common microlens for the first and second photoelectric conversion units,
wherein, when a vertex of the first microlens is orthogonally projected onto a bottom surface of the first microlens, a first distance between the projected vertex and an edge of the bottom surface facing towards the center of the pixel region is shorter than a second distance between the projected vertex and an edge of the bottom surface facing towards the periphery of the pixel region.

17. The image pickup device according to claim 16, wherein a signal read from the first photoelectric conversion unit and a signal read from the second photoelectric conversion unit are used for focus detection.

18. The image pickup device according to claim 16, further comprising:
a third photoelectric conversion unit provided in the semiconductor substrate;
a fourth photoelectric conversion unit provided in the semiconductor substrate; and
a second microlens provided as a common microlens for the third and fourth photoelectric conversion units,
wherein, when the second microlens is orthogonally projected onto the semiconductor substrate, a vertex position of the second microlens that is orthogonally projected substantially coincides with a center position of the second microlens.

19. The image pickup device according to claim 18, further comprising:
a second pixel having the third and fourth photoelectric conversion units,
wherein the first pixel is located closer to the periphery of the pixel region as compared to the second pixel.

20. The image pickup device according to claim 16, wherein the pixel region includes an effective pixel region and an optical black region,
microlenses are arranged in both the effective pixel region and the optical black region, and
at least one of the microlenses in the optical black region has a vertex position off of a center position thereof in a planar view.

21. The image pickup device according to claim 16, wherein the image pickup device further comprises a first transfer gate of a first transfer transistor configured to transfer charges generated in the first photoelectric conversion unit and a second transfer gate of a second transfer transistor configured to transfer charges generated in the second photoelectric conversion unit, and
the vertex is arranged at a position distant from the first transfer gate and the second transfer gate in a planar view.

22. The image pickup device according to claim 16, wherein the first pixel includes an amplification transistor that amplifies a signal generated by the first photoelectric conversion unit, and light is incident from a principal surface opposite the other principal surface where a gate electrode of the amplification transistor is disposed.

* * * * *